United States Patent [19]

D'Angelo et al.

[11] Patent Number: 5,473,279
[45] Date of Patent: Dec. 5, 1995

[54] INTEGRATED COMPANDER AMPLIFIER CIRCUIT WITH DIGITALLY CONTROLLED GAIN

[75] Inventors: Kevin P. D'Angelo, Dallas; Francis A. Scherpenberg, Carrollton, both of Tex.

[73] Assignee: Dallas Semiconductor Corporation, Dallas, Tex.

[21] Appl. No.: 18,654

[22] Filed: Feb. 17, 1993

[51] Int. Cl.[6] .............................. H03M 7/30; G06G 7/20
[52] U.S. Cl. ........................ 327/347; 327/100; 327/306
[58] Field of Search ........................ 330/254; 307/490, 307/493–555, 261, 264; 328/144, 127, 26, 168; 333/14; 455/72

[56] References Cited

U.S. PATENT DOCUMENTS 3,593,164  7/1971  Newbold ............................... 328/144
3,599,013  8/1971  Cope ..................................... 328/144
4,163,940  8/1979  Brewerton ............................ 328/144
4,327,329  4/1982  Papworth ............................. 328/144
4,506,174  3/1985  Hitt ...................................... 328/144
4,862,118  8/1989  Kojima .................................. 333/14
4,926,063  5/1990  Donaldson ........................... 307/144

Primary Examiner—Timothy P. Callahan
Assistant Examiner—My-Trang Nu Ton
Attorney, Agent, or Firm—Worsham, Forsythe, Sampels & Wooldridge

[57] ABSTRACT

An integrate circuit companding amplifier for analog signals with digitally controlled gain. The expansion amplifier uses a square law with presentation of sign and the compression amplifier uses the inverse (square root law with preservation of sign). A digital potentiometer determines the gain, and peak detection plus feedback control of the potentiometer provides for automatic gain control. Three wire communication can program a fixed gain.

43 Claims, 24 Drawing Sheets

INTEGRATED COMPANDER AMPLIFIER CIRCUIT WITH DIGITALLY CONTROLLED GAIN

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork fights whatsoever.

BACKGROUND AND SUMMARY OF THE INVENTION

The present invention relates to electronic devices, and, more particularly, to semiconductor devices useful for electronic communication signal transmission.

Communications

Analog communication signals have a problem of noise added during transmission which can swamp small amplitude signals. The conversion of telephone voice signals from analog to pulse code modulation (PCM) for long distance transmission provides for noise immunity, but simple linear encoding will destroy the small amplitude signal resolution due to the quantization. That is, quantization limits the dynamic range, but the dynamic range may be preserved by a nonlinear encoding to emphasize the small amplitude analog signals (compress the large amplitudes). Then taking the PCM to analog conversion with an inverse emphasis of the large amplitude codes (expansion) will recover the original analog signal. The nonlinear conversion function for the telephone systems in the United States and Japan is called the $\mu$=255 law companded PCM digital coding standard and uses the following nonlinear transfer function with $\mu$ equal to 255:

$$X \to \text{sign}(X)[\ln(1+\mu|X|)]/[\ln(1+\mu)]$$

where sign(X) is the sign of X, "ln" denotes natural logarithm, and X is normalized to lie in the range −1 to +1. That is, compression of large amplitude signals permits the preservation of the resolution of small amplitude signals.

Analog transmission similarly benefits from a transformation compressing large amplitude signals prior to transmission followed by an inverse transformation to recover the original signal. The known analog compressors and expanders use standards such as EIA 19-B which only responds to peak signal levels.

Features

The present invention provides a companding amplifier with integrated compression plus expansion amplifiers using a square law transformation and with programmable gain control which modifies the actual signal shape by square-rooting (compression) and squaring (expansion) the signal. This companding (compression/expansion) effectively increases the signal to noise ratio for small amplitude signals at the cost of lower signal to noise ratio for large amplitude signals. FIG. 1 heuristically illustrates the use of companding amplifiers in an analog signal transmission system with a noisy channel and indicates signal amplitudes at various stages. The transmission channel could include radio frequency transmissions, for example, between the handset and the base in a cordless telephone or a wireless microphone.

BRIEF DESCRIPTION OF THE DRAWINGS

The present invention will be described with reference to the accompanying figures which are schematic for clarity.

DESCRIPTION OF THE PREFERRED EMBODIMENTS

Operation overview

Figure 1:
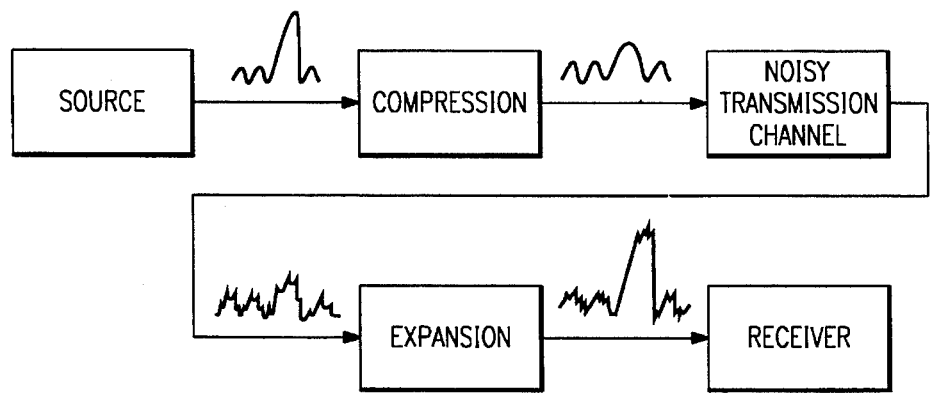
FIG. 1 illustrates analog signal transmission with companding.
Figure 2:
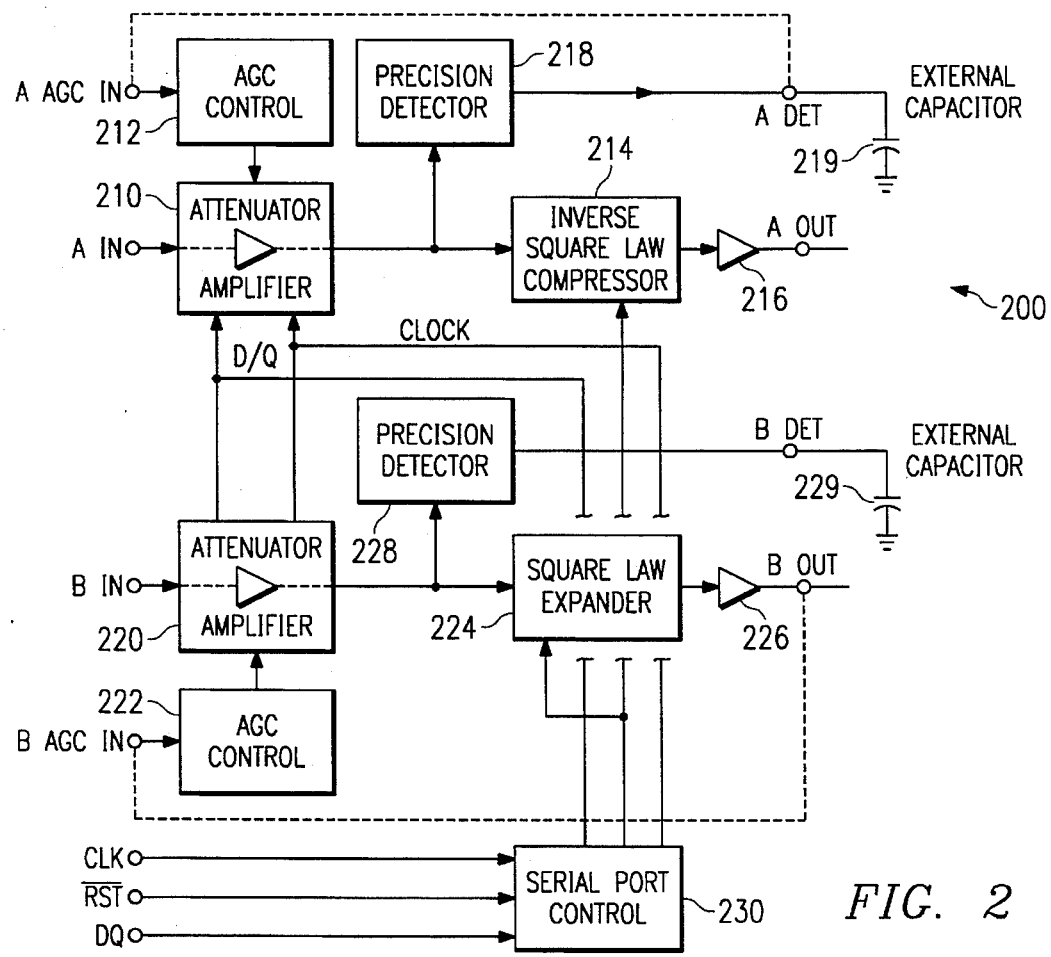
FIG. 2 is a functional block circuit diagram of the first preferred embodiment companding amplifier.

FIG. 2 is a functional block circuit diagram of a first preferred embodiment companding amplifier, generally denoted by reference numeral 200, which includes channel A for compression and channel B for expansion. In particular, channel A has attenuator/amplifier 210, automatic gain control (AGC) 212, square root law compressor 214, output buffer 216, and peak detector 218. Channel B has attenuator/amplifier 220, automatic gain control (AGC) 222, square law compressor 224, output buffer 226, and peak detector 228. Companding amplifier 200 also includes three-wire serial communication interface and control unit 230 for control of attenuator/amplifiers 210 and 220 as an alternative to AGC control. Capacitors 219 and 229 may be external to an integrated circuit comprising the remainder of companding amplifier 200 and provide time constants for channels A and B, respectively. The power rails are at ground and Vdd (about +5 volts), so the analog ground for inputs to channels A and B is taken as Vdd/2 (about 2.5 volts).

Figure 3:
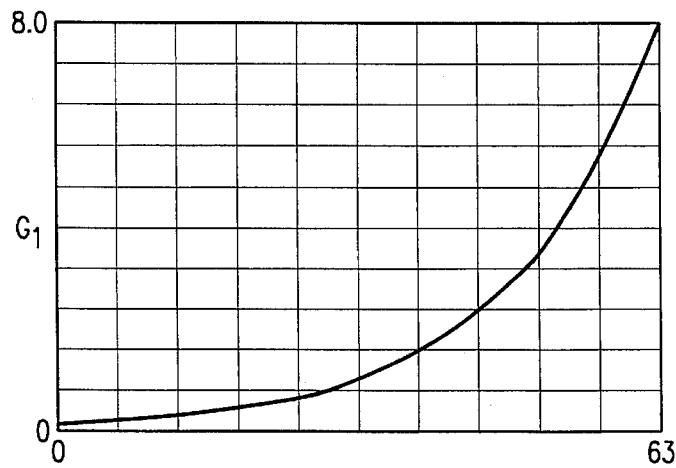
FIG. 3 shows AGC amplifier gain.

Channel A and channel B analog input signals at terminals AIN and BIN drive attenuator/amplifiers 210 and 220, respectively. The attenuator/amplifiers are controlled by a digital signal from three-wire serial control unit 230 or the AGC inputs through AGCs 212 and 222. A variable gain buffer amplifier located within each of the attenuator/amplifiers provides for a high input impedance. A signal is then amplified or attenuated depending on the level of the input and the setting of a variable gain amplifier. The variable gain amplifier has a gain in the range of 0.133 to 8 which is selected by programming a digitally controlled potentiometer; FIG. 3 shows the gain as a function of a 6-bit digital input. Input signal voltage levels from a minimum of 5 mV (amplifier offset) to power supply Vdd (5 volts) may be amplified or attenuated. This AGC gain curve makes for constant differential gain between gain settings. There are 64 gain settings; see FIG. 7. Buffers 213 and 223 buffer the outputs of the attenuator/amplifiers and feed detectors 218 and 228 plus compressor 214 and expander 224, respectively.

Detectors 218 and 228 transform the peak ouput of the attenuator/amplifiers into DC voltage levels in the range of 0 volts to power supply Vdd at nodes ADET and BDET, respectively. The gain of the attenuator/amplifiers can be controlled by inputs to AGCs 212 and 222. When enabled, the AGCs will attenuate any input signal which is greater than 800 mV and amplify any signal which is less than 750 mV (relative to analog ground at Vdd/2) so that the peak output of channel A or channel B is between 800 mV and 1 volt. In applications where automatic gain control is required, the ADET and BDET outputs could be connected to the respective AGC inputs, AAGCIN and BAGCIN. However, in applications where automatic gain control rerquirements are external, the AGC inputs accept DC signal levels from 0 volts to the power supply level Vdd, and the detector outputs must be monitored so that the maximum peak detected entering channel A or channel B does not exceed 1.5 volts. Whenever the AGCs are enabled, the outputs of both channel A and channel B will be between 0 and 1 volt. The AGCs are enabled and disabled via commands over the three-wire serial port, but the default setting of both AGCs is enablement on power up.

Compressor 214 applies a square law transformation to the output of attenuator/amplifier 210 and drives output buffer 216 which produces an output at AOUT in the range of 0 to 1 volt. Expander 224 applies a square root law transformation to the output of attenuator/amplifier 210 and drives output buffer 226 to also produce an output at BOUT in the range of 0 to 1 volt. Input signals should have frequencies in the range of 15 Hz to 10 KHz.

Architecture

Figure 4A:
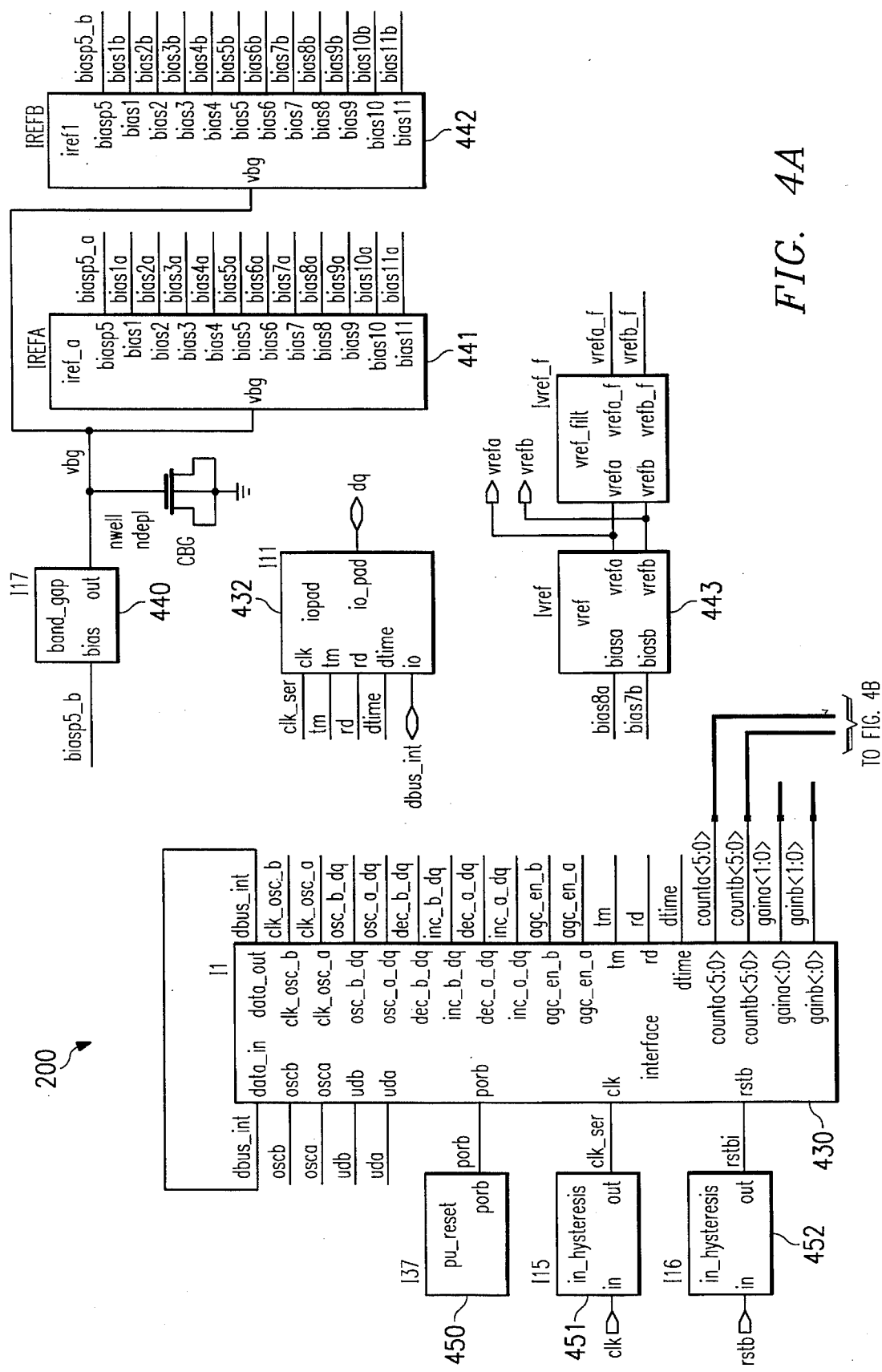
FIGS. 4a and 4b is a structural block circuit diagram of the first preferred embodiment companding amplifier, which corresponds to the functional block diagram of the preferred embodiment companding amplifier shown in FIG. 2.
Figure 4B:
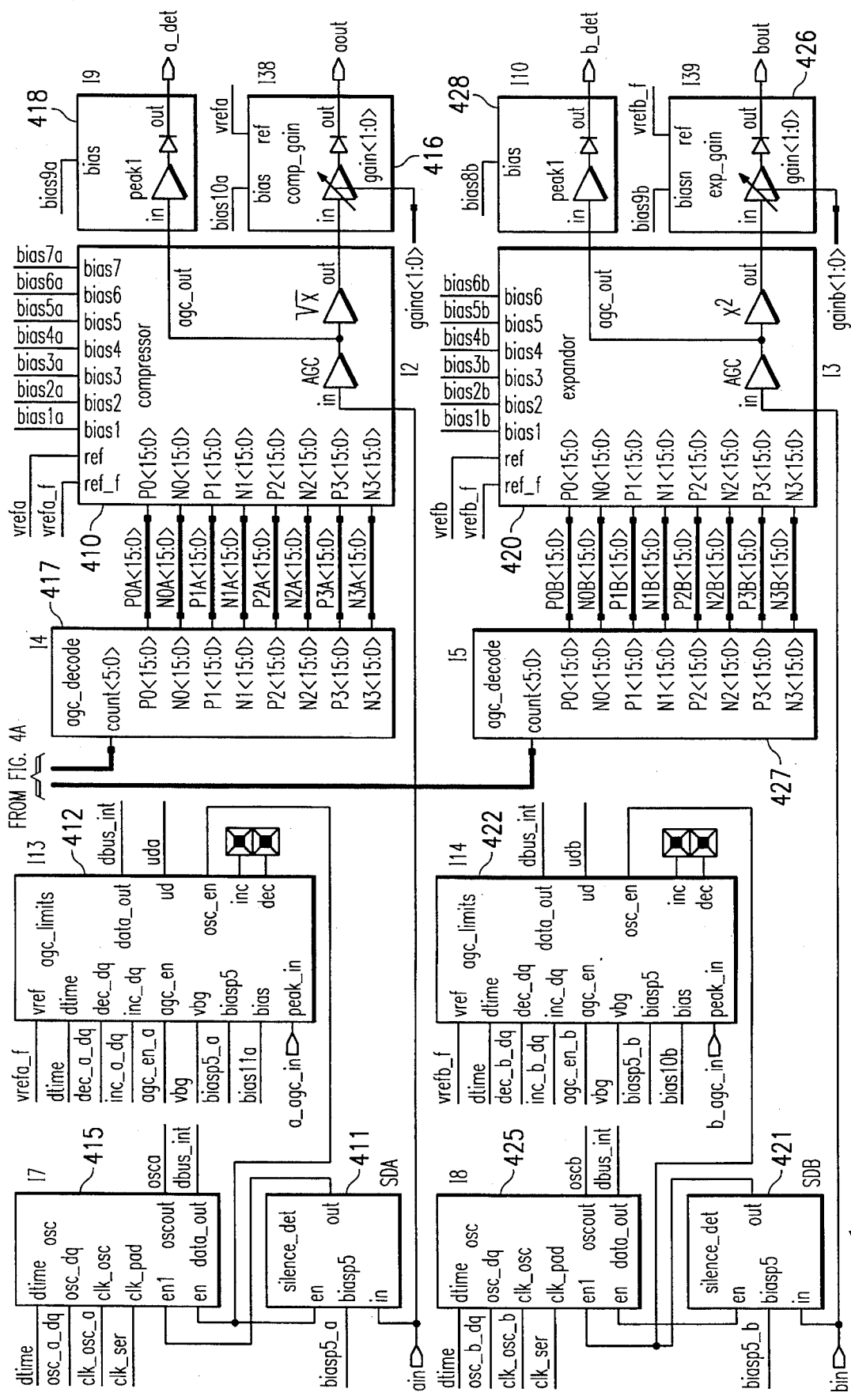

FIGS. 4a and 4b shows companding amplifier 200 in structural block format with compressor channel A including compressor block 410, peak detector block 418, and variable gain amplifier 416, plus silence detector 411, oscillator 415, AGC limiter 412, and AGC decoder 417. Similarly, expander channel B including expander block 420, peak detector block 428, and variable gain amplifier 426, plus silence detector 421, oscillator 425, AGC limiter 422, and AGC decoder 427. The three-wire communication control appears in interface block 430 and IO block 432, and internally-generated reference and bias voltages derive from bandgap generator 440 and blocks 441–443. Block 450 generates a power on reset and blocks 451–452 provide hystersis for the RSTB and CLK three-wire inputs. Because the expander block 420 is simpler than compressor block 410, first consider the blocks of expander channel B.

FIGS. 4a and 4b correlates with FIG. 2 in the following fashion Attenuator/amplifier 210 in FIG. 2 corresponds and is preferably comprised of portions of circuitry contained in compressor block in FIGS. 4a and 4b. Automatic gain control (AGC) 212 in FIG. 2 corresponds and is preferably comprised of silence detector 411, AGC limiter 412, oscillator 415, AGC decoder 417, and portions of circuitry contained in interface block 430 in FIGS. 4a and 4b. Peak detector 218 in FIG. 2 corresponds and is preferably comprised of peak detector block 418 in FIGS. 4a and 4b. Square root law compressor 214 in FIG. 2 corresponds and is preferably comprised of portions of circuitry contained in compressor block 410 in FIGS. 4a and 4b. Peak detector 228 in FIG. 2 corresponds and is preferably comprised of peak detector block 428 in FIGS. 4a and 4b. Attenuator/amplifier 220 in FIG. 2 corresponds and is preferably comprised of expander block 420 in FIGS. 4a and 4b. Output buffer 216 in FIG. 2 corresponds to and is preferably comprised of variable gain amplifier 416 in FIGS. 4a and 4b. Square law compressor 224 in FIG. 2 corresponds to and is preferably comprised of expander block 420 in FIGS. 4a and 4b. Automatic gain control (AGC) 222 in FIG. 2 corresponds and is preferably comprised of silence detector 421, oscillator 425, AGC limiter 422, AGC decoder 427, and interface block 430 in FIGS. 4a and 4b. Three-wire serial control unit 230 in FIG. 2 corresponds to and is preferably comprised of interface block 430 and 432 in FIGS. 4a and 4b. Output buffer 226 in FIG. 2 corresponds to and is preferably comprised of variable gain amplifier 426 in FIGS. 4a and 4b. Expander 224 in FIG. 2 corresponds to and is preferably comprised of expander block 420 in FIGS. 4a and 4b.

Figure 5:
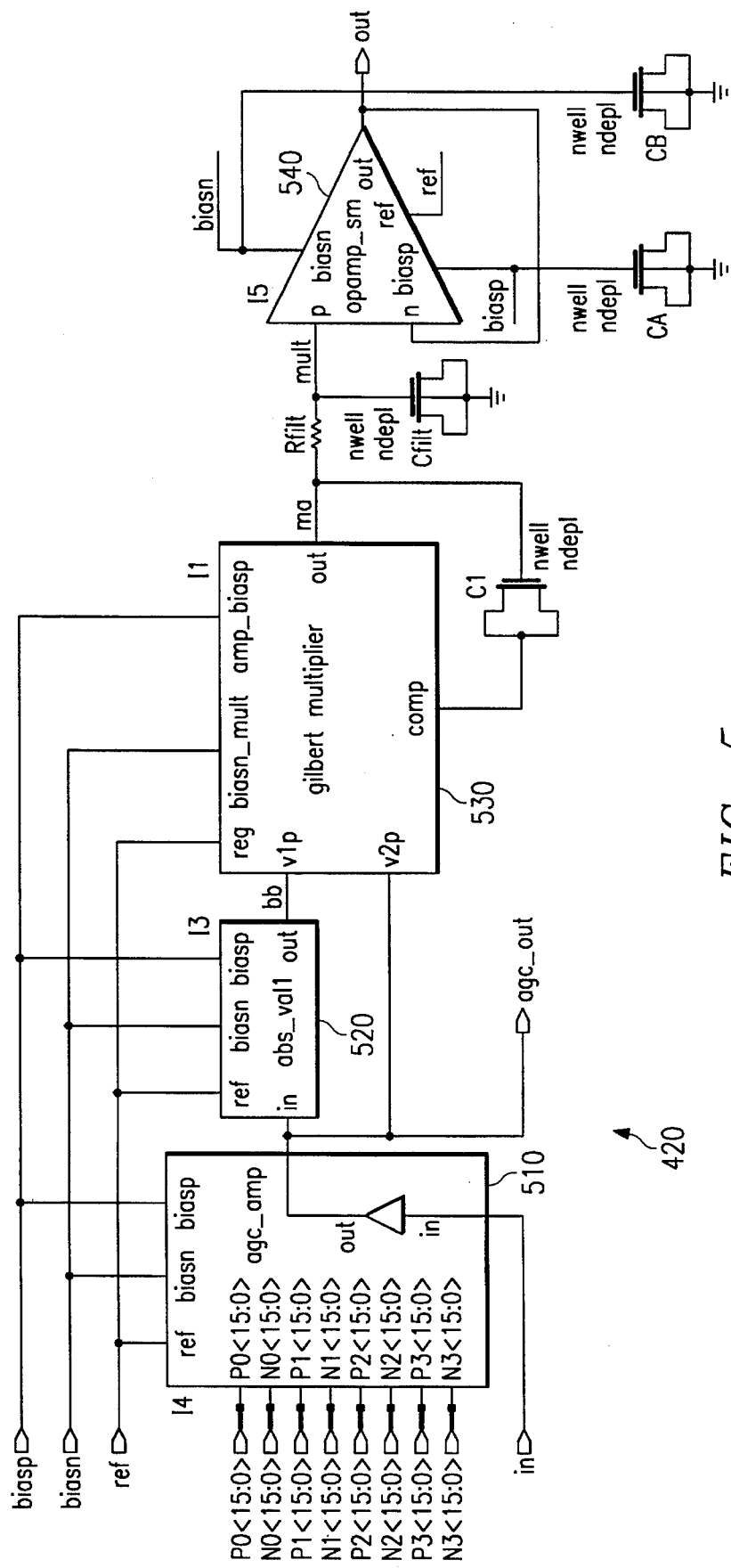
FIG. 5 is a schematic circuit diagram that shows expander block 420 in FIGS. 4a and 4b is a preferred embodiment of attenuator/amplifier 220 and 224 in FIG. 2, as AGC amplifier block 510, absolute value circuit block 520, four quadrant multiplier 530, voltage follower 540, plus filter capacitor.

FIG. 5 shows expander block 420 as AGC amplifier block 510, absolute value circuit block 520, four quadrant multiplier 530, voltage follower 540, plus filter capacitors. FIGS. 6–10 show these blocks both heuristically and in detail, as follows.

Figure 6:
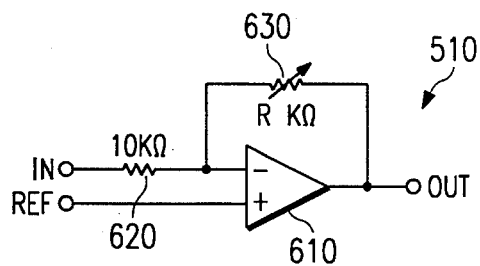
FIG. 6 is a heuristic circuit diagram of AGC amplifier block 510 shown in FIG. 5, which is a preferred embodiment of attenuator/amplifier 210.

AGC amplifier block 510 appears heuristically in FIG. 6 and basically consists of operational amplifier (opamp) 610 with reference voltage REF feeding its positive input and the input signal from BIN connecting to node IN (see FIG. 4) and then through 10 Kohm resistor 620 to feed its negative input. The voltage REF is the analog ground at Vdd/2. Digitally controlled variable feedback resistor 630 makes block 510 into a difference amplifier with output proportional to the difference between the voltage at IN and the voltage REF. In particular, when the resistance of resistor 630 is R Kohms, then the voltage at node OUT ($V_{AMP}$) relates to the reference voltage at REF ($V_{REF}$) and the input voltage at IN ($V_{BIN}$) by:

$$(V_{AMP}-V_{REF})/R=(V_{REF}-V_{BIN})/10$$

with $V_{REF}$ the analog ground fixed voltage of Vdd/2 and $V_{BIN}$ varying in the range of from about 0 to Vdd. Thus the output signal relative to analog ground ($V_{AMP}-V_{REF}$) equals the input signal relative to analog ground ($V_{BIN}-V_{REF}$) with a gain of $-R/10$. Variable resistor 630 has a resistance range of 1.333 Kohms to 80 Kohms (R varies from 1.333 to 80), so the gain varies from 0.1333 to 8.0 as illustrated in FIG. 3.

Figure 7A:
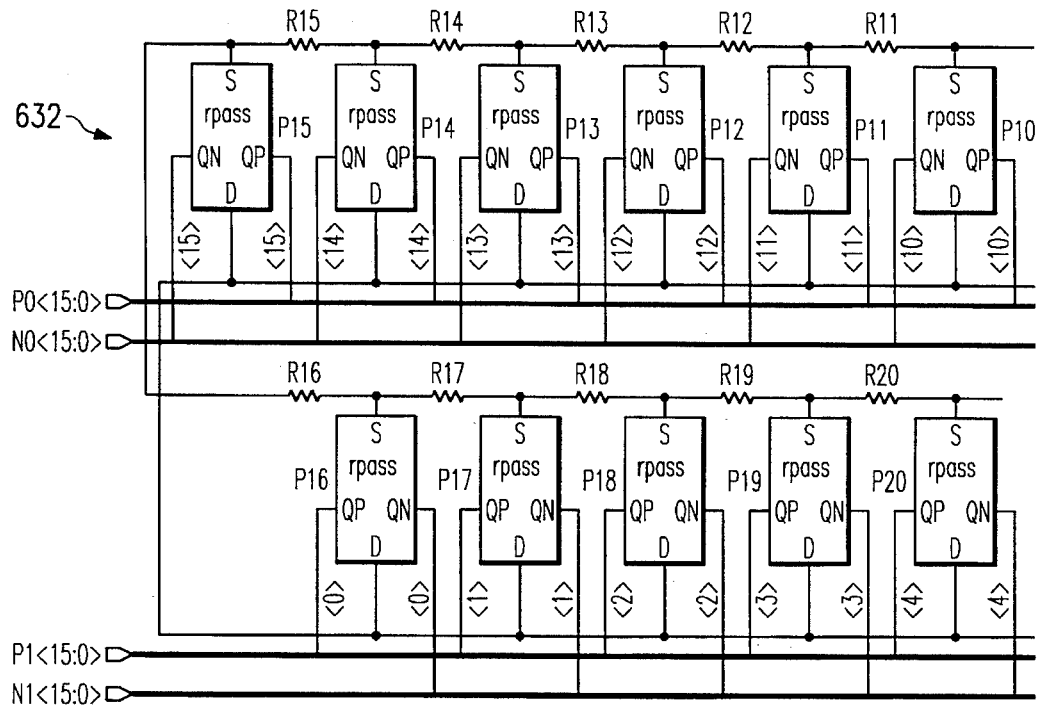
FIGS. 7a, 7b, and 7c is a schematic circuit diagram of AGC amplifier block 510 schematically with variable resistor 630, which comprises a portion of a preferred embodiment of attenuator/amplifier 210 of FIG. 2.
Figure 7A:
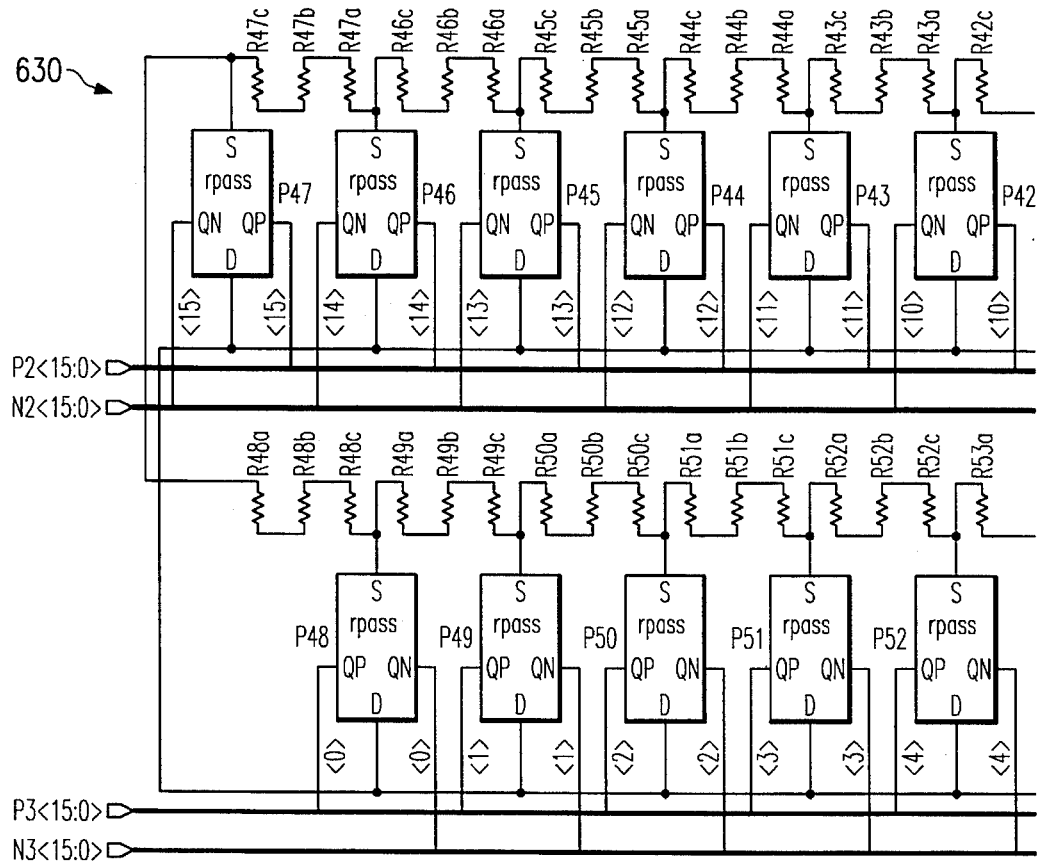
Figure 7B:
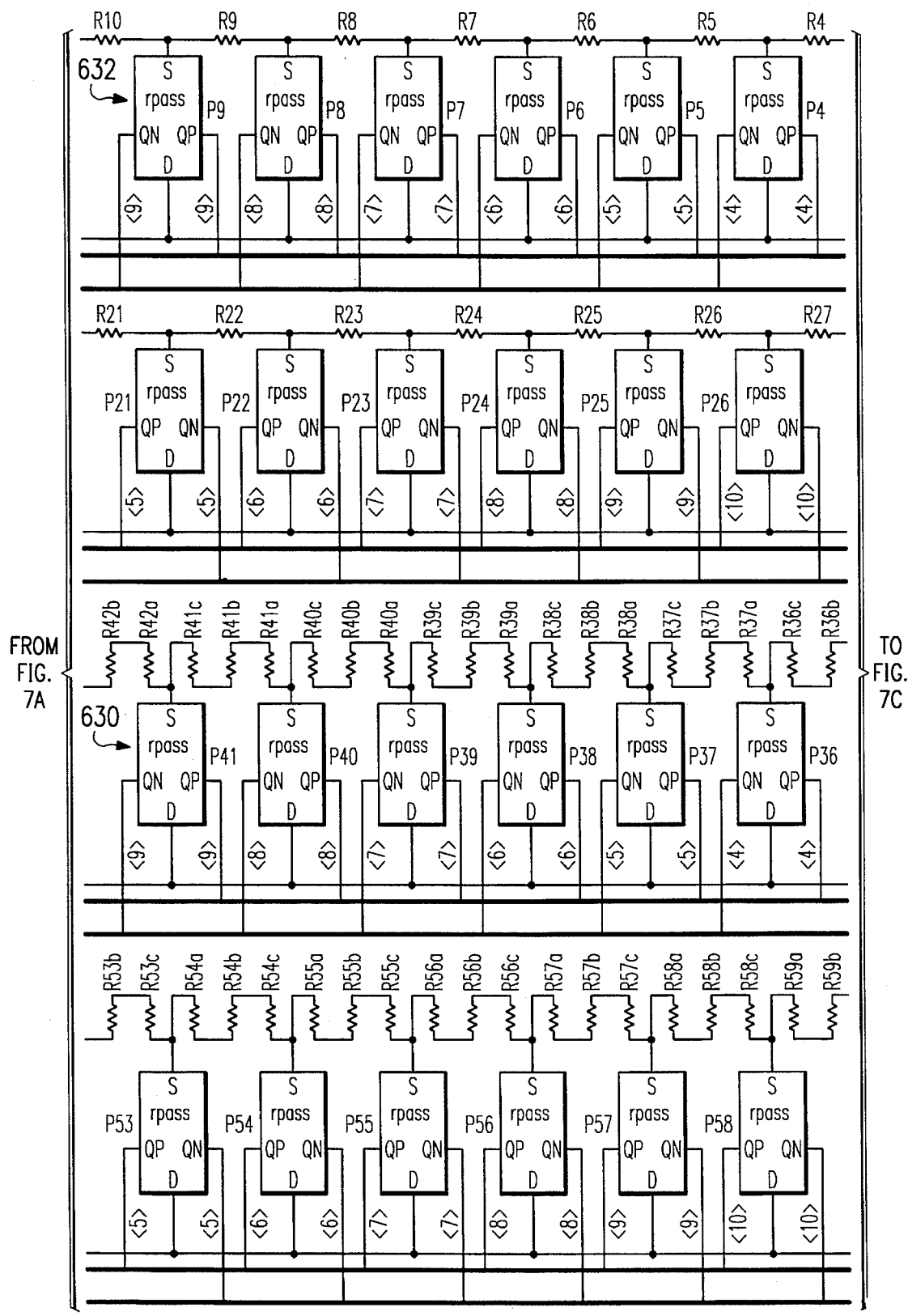
Figure 7C:
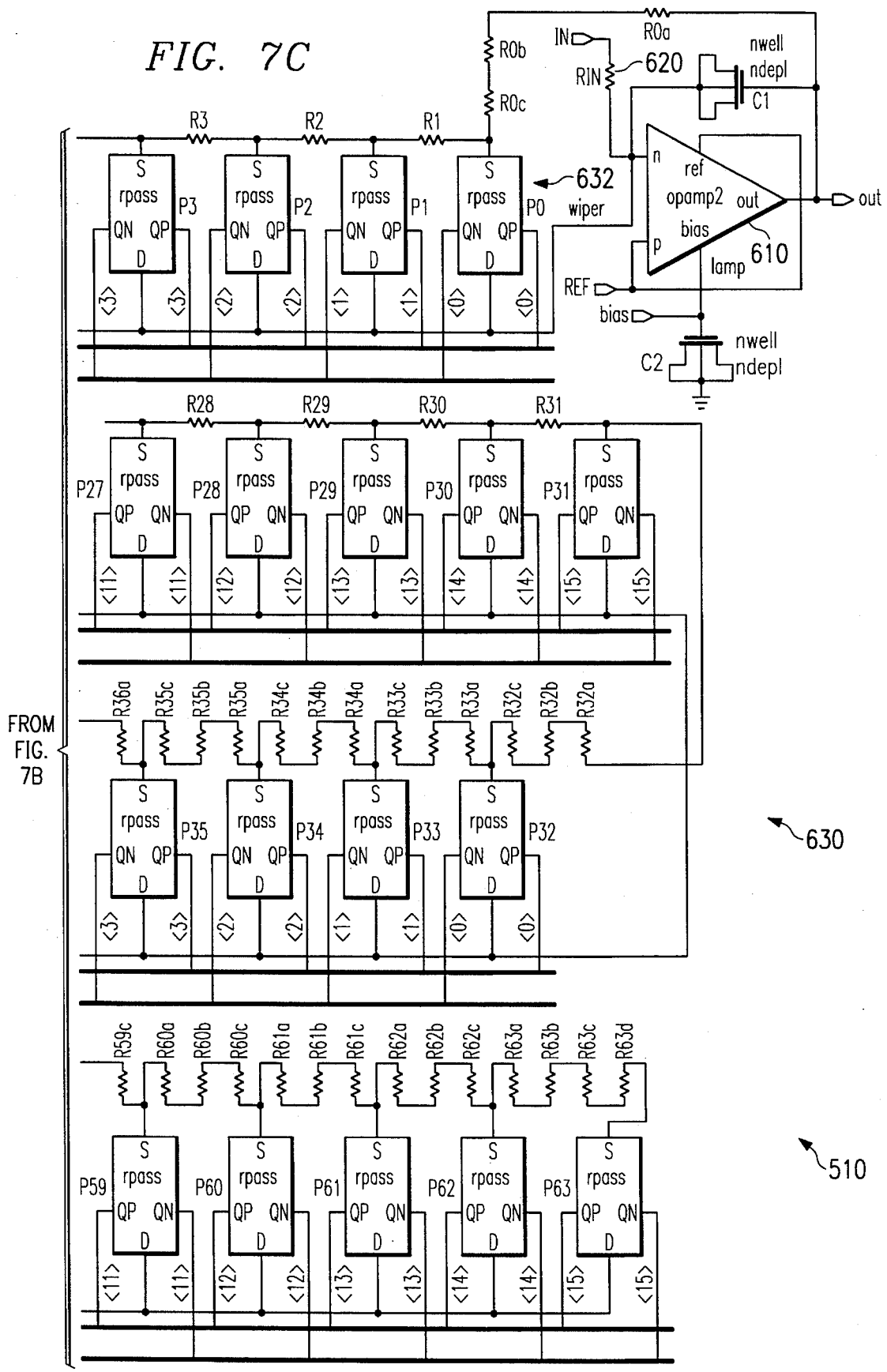

FIGS. 7a, 7b and 7c show AGC amplifier block 510 schematically with variable resistor 630 filling up most of the Figure. Indeed, resistor 630 is a string of 65 resistors with 64 taps organized as four rows of 16 taps each; each tap has a transmission gate (reference numeral indicates one of the gates) with positive and negative gate control signals on 16-bit busses PJ<15:0> and NJ<15:0>, respectively, for the Jth row. The minimum resistance is 1.333 Kohms and the maximum resistance is 80 Kohms, and the resistance varies in constant ratio steps. FIG. 7a, 7b and 7c also shows the bias voltages for opamp 610 and filter capacitors.

Figure 8:
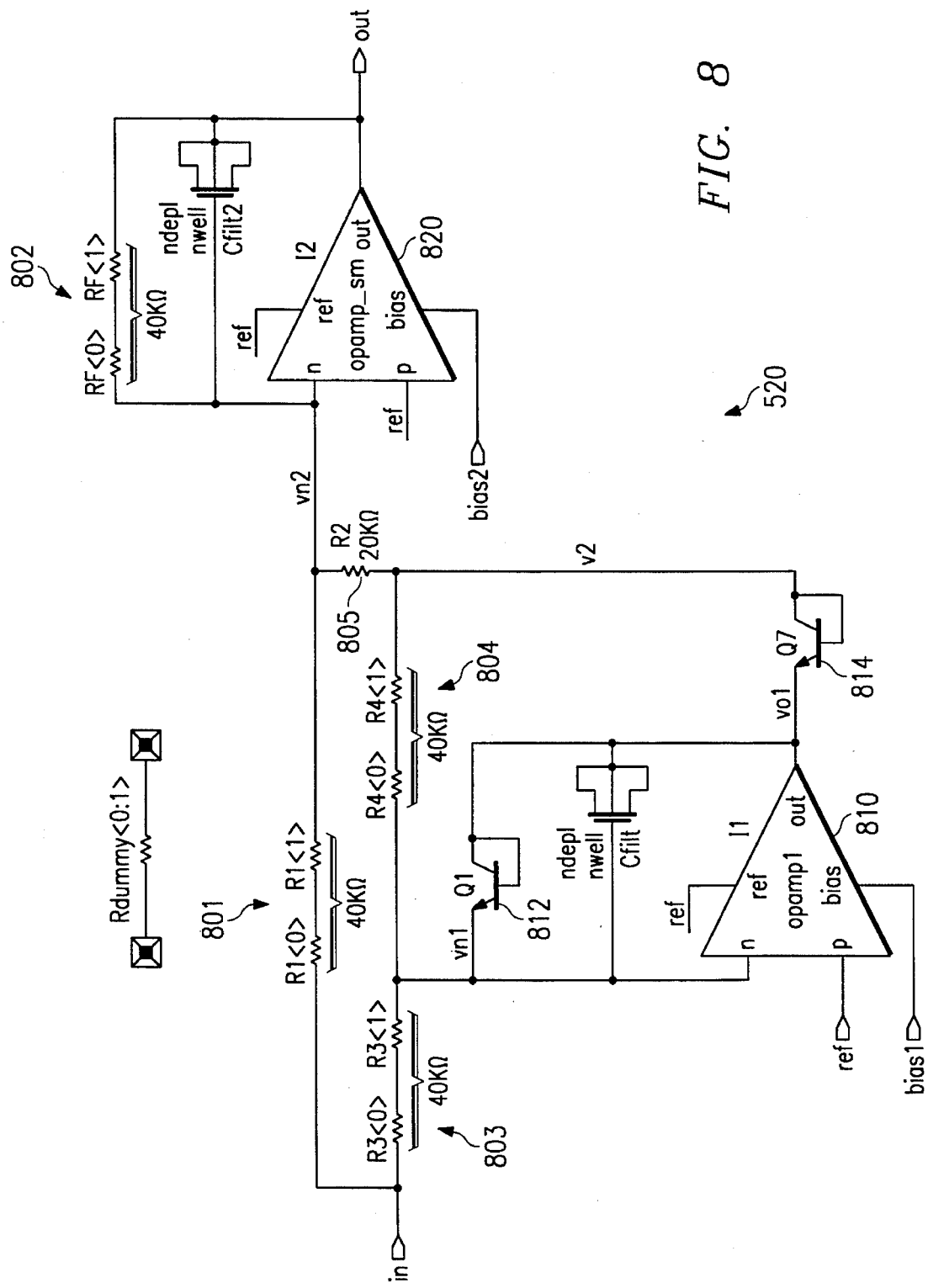
FIG. 8 is a schematic circuit diagram of absolute value circuit 520 of FIG. 5 that is part of a preferred embodiment of square root law compressor 214 of FIG. 2 and square law expander 224 of FIG. 2.

FIG. 8 shows absolute value circuit 520 as basically an fullwave rectifier relative to $V_{REF}$. In particular, if the voltage at the input IN is less than $V_{REF}$, then the output of opamp 810 is clamped to $0.7+V_{REF}$ by diode 812 (an NPN with base connected to collector) and disconnected from the summing point of opamp 820 by diode 814 (another diode-connected NPN); opamp 820 then operates as a simple unity-gain inverter relative to $V_{REF}$ with a 40 Kohm input resistor 801 and a 40 Kohm feedback resistor 802. Hence, the output is positive relative to $V_{REF}$. Note that the node between resistors 803 and 804 remains at $V_{REF}$ due to opamp 810, so resistors 803–805 do not provide a parallel path to input resistor 801.

Conversely, with an input greater than $V_{REF}$, opamp 810 forms a unity gain inverter with input 40 Kohm resistor 803 and feedback 40 Kohm resistor 804 and with output connected to the summing point of opamp 820 through 20 Kohm resistor 805. Diode 814 does not affect the accuracy because it is within the feedback loop. Positive current enters the summing point of opamp 820 from input resistor 801 and negative current is drawn from the summing point through resistor 805. Because the voltages across resistor 805 and resistor 801 are equal, but resistor 805 has only half the resistance of resistor 801, the negative current is double the positive current at the summing point of opamp 810. This implies that the net is a current of the same magnitude as in the case of an input less than $V_{REF}$, but with opposite sign. Hence, the output at OUT is again positive relative to $V_{REF}$ and absolute value circuit 520 outputs the absolute value of $V_{AMP}-V_{REF}$ added to $V_{REF}$; that is, $|V_{AMP}-V_{REF}|+V_{REF}$.

Figure 10:
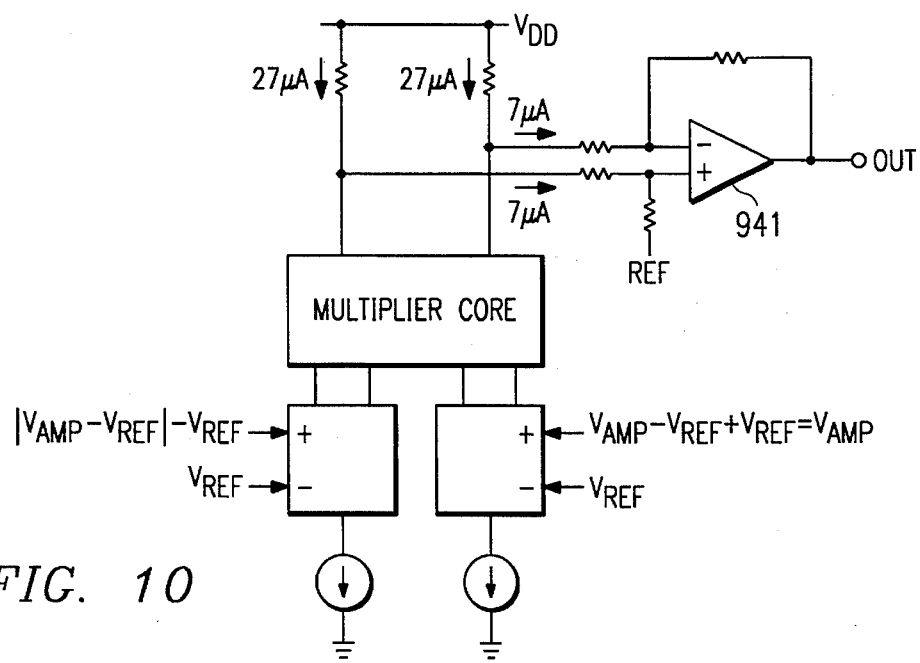
FIG. 10 is a schematic circuit diagram of op amp 941 of FIG. 9, which is connected as a difference amplifier with output relative to $V_{REF}$, and forms part of a preferred embodiment of square root law compressor 214 and inverse law expander 224 of FIG. 2.
Figure 9:
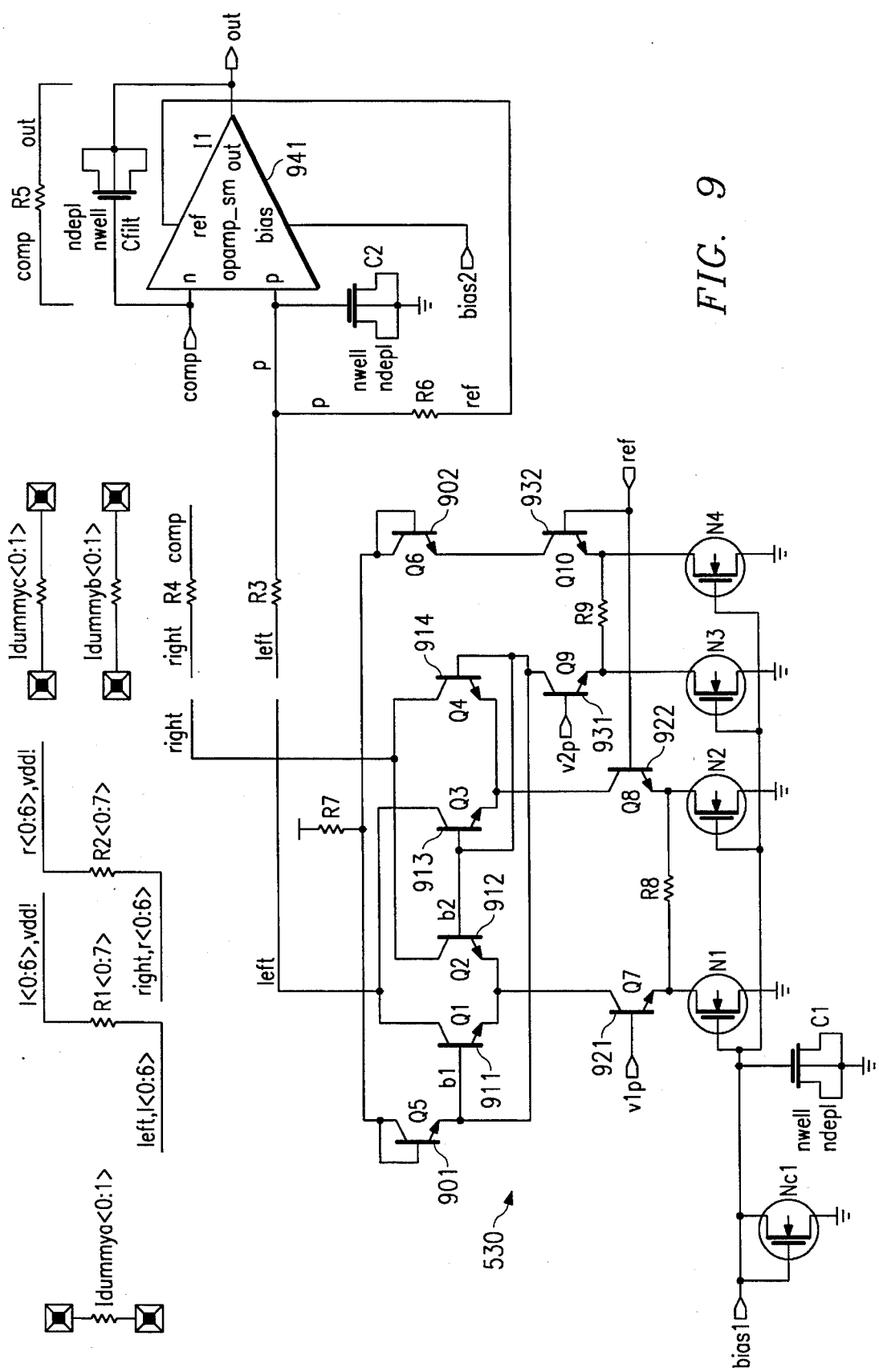
FIG. 9 is a schematic circuit diagram of multiplier 530 of FIG. 5 that is part of a preferred embodiment of square root law compressor 214 of FIG. 2 and square law expander 224 of FIG. 2.

FIG. 9 shows multiplier 530 as a four quadrant multiplier with multiplier core made of diode connected NPNs 901–902 and cross-coupled NPNs 911–914; NPNs 921–922 and NPNs 931–932 provide the voltage-to-current converters for the two inputs; and opamp 941 plus input and feedback resistors forms the differential-to-single ended output. FIG. 5 shows the two inputs are $|V_{AMP}-V_{REF}|+V_{REF}$ and $V_{AMP}-V_{REF}+V_{REF}$, from absolute value circuit 520 and amplifier 510, respectively. FIG. 9 shows that the differential inputs are relative to $V_{REF}$, so the terms multiplied are just $|V_{AMP}-V_{REF}|$ and $V_{AMP}-V_{REF}$, and the output at OUT is then $K|V_{AMP}-V_{REF}|(V_{AMP}-V_{REF})+V_{REF}$ where K is the multiplier gain. FIG. 10 illustrates opamp 941 connected as a difference amplifier with output relative to $V_{REF}$; choice of the resistor values sets K equal 0 to 1/10. Thus the multiplier 530 output of $K|V_{AMP}-V_{REF}|(V_{AMP}-V_{REF})+V_{REF}$ feeds voltage follower 540 (see FIG. 5) and then inverting variable gain amplifier 426 (see FIG. 11) which drives output terminal BOUT. Thus the voltage at BOUT ($V_{BOUT}$) satisfies the relation:

$$V_{BOUT}-V_{REF}=(V_{BIN}-V_{REF})|V_{BIN}-V_{REF}|KGR^2/100$$

where $-G$ is the gain of amplifier 426, K multiplier 530 gain, and R the resistance in Kohms of variable resistor 630 in $AGC_{13}AMP$.

Figure 11:
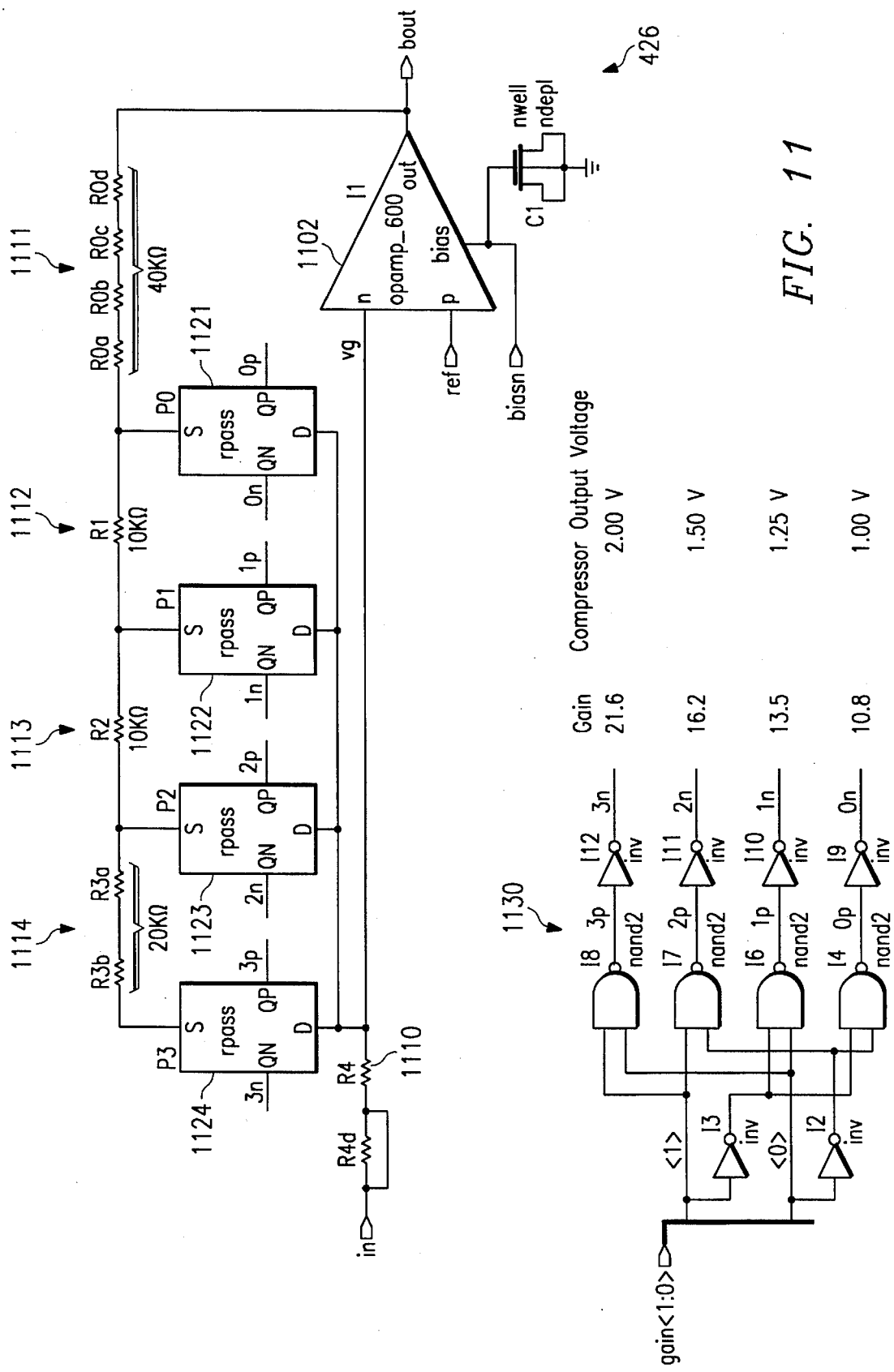
FIG. 11 is a schematic circuit diagram of inverting variable gain amplifier 426 of FIGS. 4a and 4b, which is a preferred embodiment of output buffer 226 in FIG. 2.

FIG. 11 shows inverting variable gain amplifier 426 as just opamp 1102 with 10 Kohm input resistor 1110 and a variable feedback resistor made of the series connection of 40 Kohm resistor 1111, 10 Kohm resistor 1112, 10 Kohm resistor 1113, and 10 Kohm resistor 1114. Decoder 1130 decodes a 2-bit signal on bus GAIN<1:0> to control transmission gates 1121–1124 to set the gain through bypassing individual feedback resistors. The gain selections are 4, 5, 6, or 8. The input signal relative to $V_{REF}$ of maximum amplitude 0.25 volt, so the output maximum is 1.00, 1.25, 1.50, or 2.00 volts.

Figure 12:
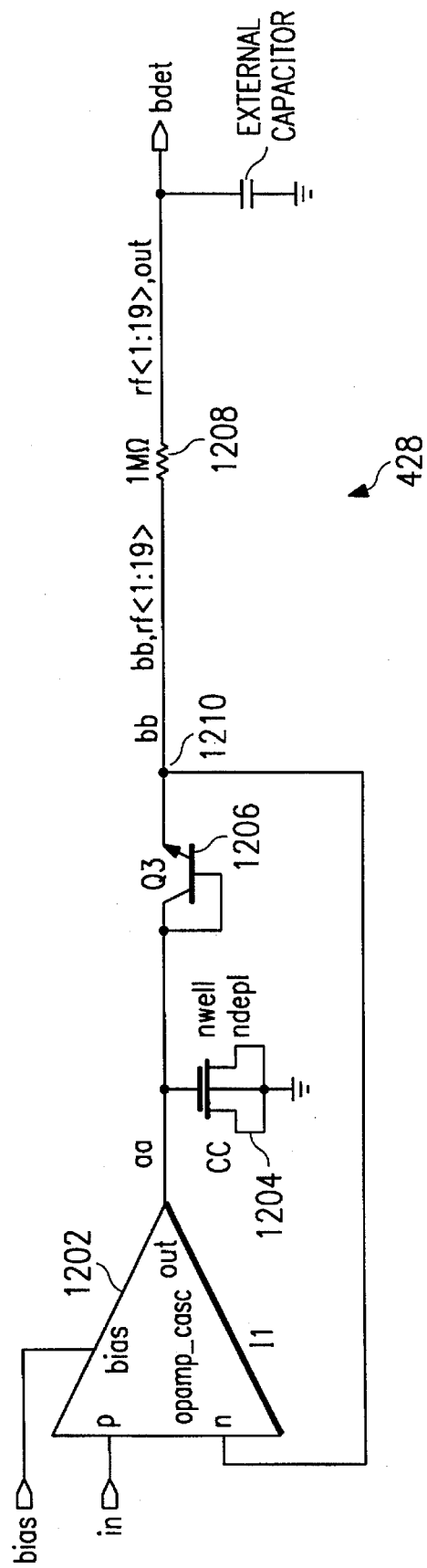
FIG. 12 is a schematic circuit diagram of peak detector 428 of FIG. 4, which is a preferred embodiment of peak detectors 228 and 218 of FIG. 2.

FIG. 12 shows peak detector 428 as made of opamp 1202 with a feedback loop including diode (diode-connected NPN) 1204 and capacitor 1206 plus output 1 Mohm resistor 1208 connecting to output terminal BDET and an external timing capacitor. Detector 428 simply tracks increasing voltage at input IN which connects to the positive input of opamp 1202 by the feedback from node 1210 to the negative input of opamp 1202. Opamp 1202 charges the external capacitor through diode 1206 with a time constant dependent upon the external capacitance plus 1 Megohm output resistor 1208. With an external 0.1 μF capacitor the time constant is about 100 msec. Conversely, when the voltage at input falls, opamp 1202 outputs a low because the charge on the external capacitor continues driving the negative input; but diode 1206 prevents opamp 1202 from discharging the external capacitor. Rather, the external capacitor discharges by leakage with a time constant of about 2 seconds. FIGS. 4–5 show that the input to peak detector 428 is the output of amplifier 510; that is, $V_{AMP}$. Thus terminal BDET (and the external capacitor) tracks the peak of the output of $V_{AMP}$.

Connecting the output at terminal BDET (and similarly ADET) to the input terminal BAGCIN (and similarly AAG- CIN) provides automatic gain control for amplifier block 510 (and similarly amplifier block 1310). Discussion of this automatic gain control appears in the Gain Control section following the Three-wire Communication section.

Channel A operation and components are analogous to those of channel B but with compression replacing expansion. In particular, compressor 410, shown in FIG. 13, basically uses the same blocks as expander 420, shown in FIG. 5, but connected to apply the inverse function: square root with sign.

Figure 13:
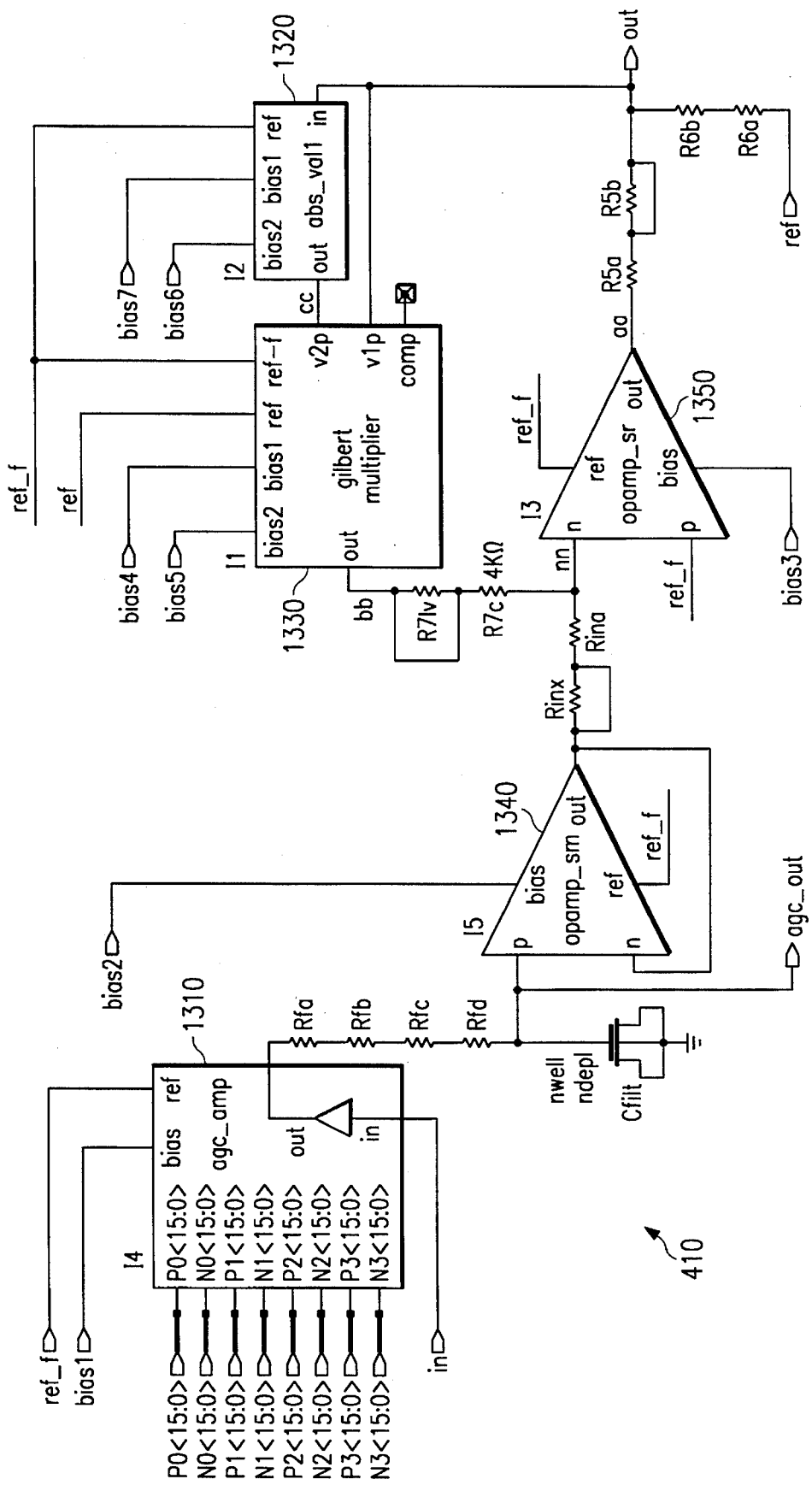
FIG. 13 is a schematic circuit diagram of compressor block 410 of FIGS. 4a and 4b, which is a preferred embodiment of AGC Amplifier 210 and inverse square law compressor 214 of FIG. 2.

FIG. 13 shows compressor block 420 as AGC amplifier block 1310, absolute value circuit block 1320, four quadrant multiplier 1330, voltage follower 1340, . . . 1350, plus filter capacitors.

AGC amplifier block 1310 is the same as AGC amplifier block 510 of channel B; see FIGS. 6–7. As FIGS. 4a and 4b shows, the bus controlling the resistance of the variable feedback resistor in block 1310 comes from decoder 417, whereas the bus for block 510 comes from decoder 427. As with amplifier block 510, when the variable resistance equals R Kohms, the voltage at node OUT ($V_{AMP}$) relates to the reference voltage at REF ($V_{REF}$) and the input voltage at IN ($V_{AIN}$) by:

$$(V_{AMP} - V_{REF})/R = (V_{REF} - V_{AIN})/10$$

with $V_{REF}$ the analog ground fixed voltage of Vdd/2 and $V_{AIN}$ varying in the range of from about 0 to Vdd. Thus the output signal relative to analog ground ($V_{AMP} - V_{REF}$) equals the input signal relative to analog ground ($V_{AIN} - V_{REF}$) with a gain of $-R/10$. The output $V_{AMP}$ of amplifier 1310 feeds voltage follower 1340 and then 10 Kohm input resistor of opamp 1350.

Absolute value circuit 1320 is the same as absolute value circuit 520 shown in FIG. 8, and four quadrant multiplier 1330 is the same as four quadrant multiplier 530, both circuits again operate relative to $V_{REF}$, and again a direct signal plus its absolute value are the two inputs to the multiplier. However, compressor 410 connects multiplier 1330 and absolute value circuit 1320 along with a 4 Kohm resistor in the feedback loop of opamp 1350, rather than as recipients of the $V_{AMP}$ output as in compressor 410. Thus with the output at terminal OUT denoted $V_O$, multiplier 1330 has an output to the 4 Kohm feedback resistor of $K|V_O - V_{REF}|(V_O - V_{REF}) + V_{REF}$ where K is again the multiplier gain. Thus the opamp 1350 feedback implies:

$$(V_{AMP} - V_{REF})/10 = -[K|V_O - V_{REF}|(V_O - V_{REF})]/2$$

This implies that $V_O - V_{REF}$ varies as the square root of $|V_{AMP} - V_{REF}|$ but with the opposite sign.

Figure 14:
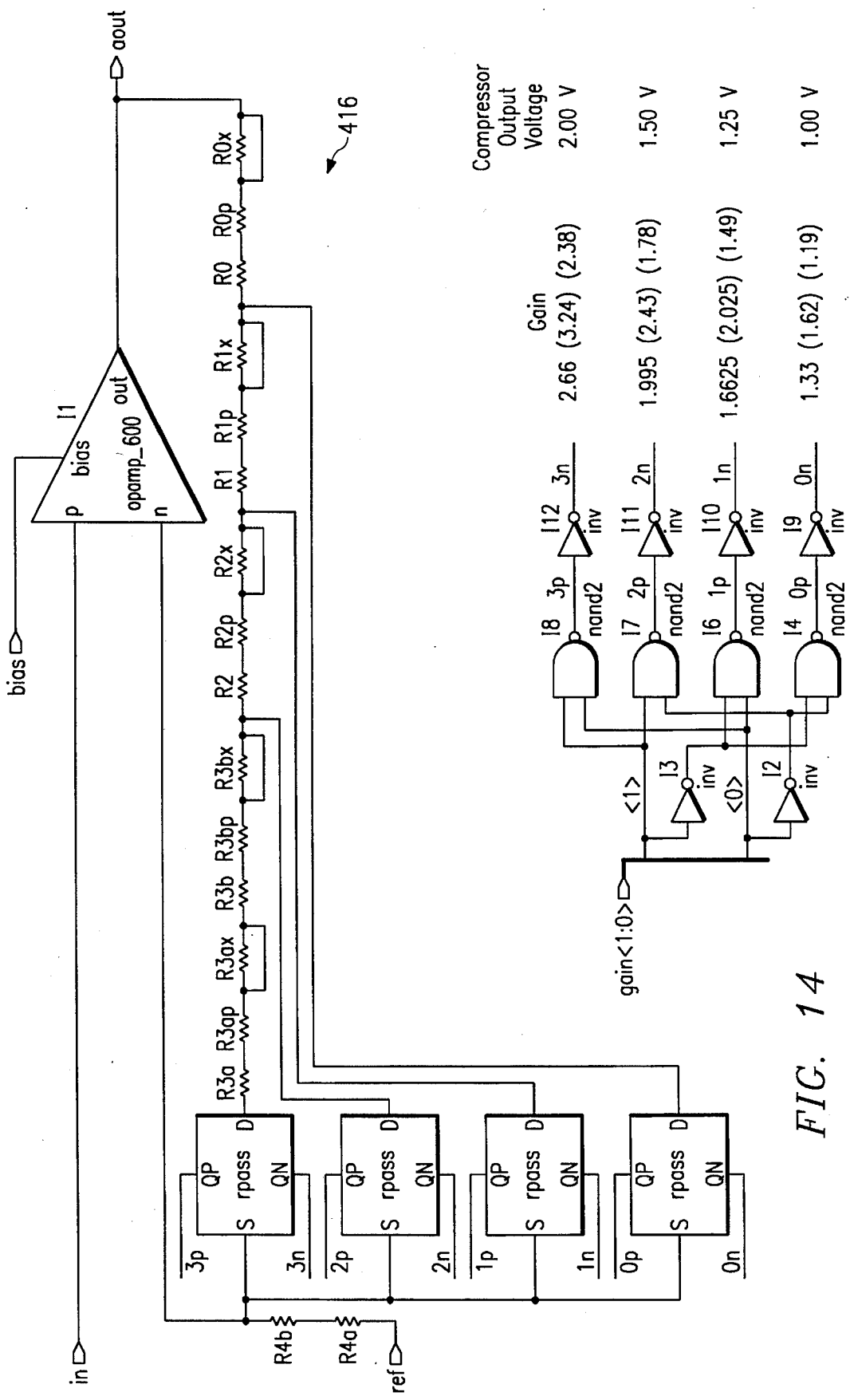
FIG. 14 is a schematic circuit diagram of amplifier 416 of FIGS. 4a and 4b, which is a preferred embodiment of buffer 216 of FIG. 2.

Lastly, the output $V_O$ drives variable gain inverting amplifier 416 which outputs at terminal AOUT. Amplifier 416 (FIG. 14) is analogous to amplifier 426 (FIG. 11) but with different gains determined by the two bits on bus GAINA<1:0>; see FIGS. 4a and 4b. Thus the overall channel A operation with multiplier gain K, amplifier 416 gain $-G$, and amplifier block 1310 gain of $-R/10$ is $$V_{AOUT} - V_{REF} = \text{sign } G\sqrt{2KR|V_{AIN} - V_{REF}|}/10$$

where sign is the sign of $V_{AIN} - V_{REF}$.

Peak detector 418 operates in the same manner as peak detector 428 but with terminal ADET in place of terminal BDET; see FIGS. 4a and 4b and 12.

Three-wire Communication

Figure 15:
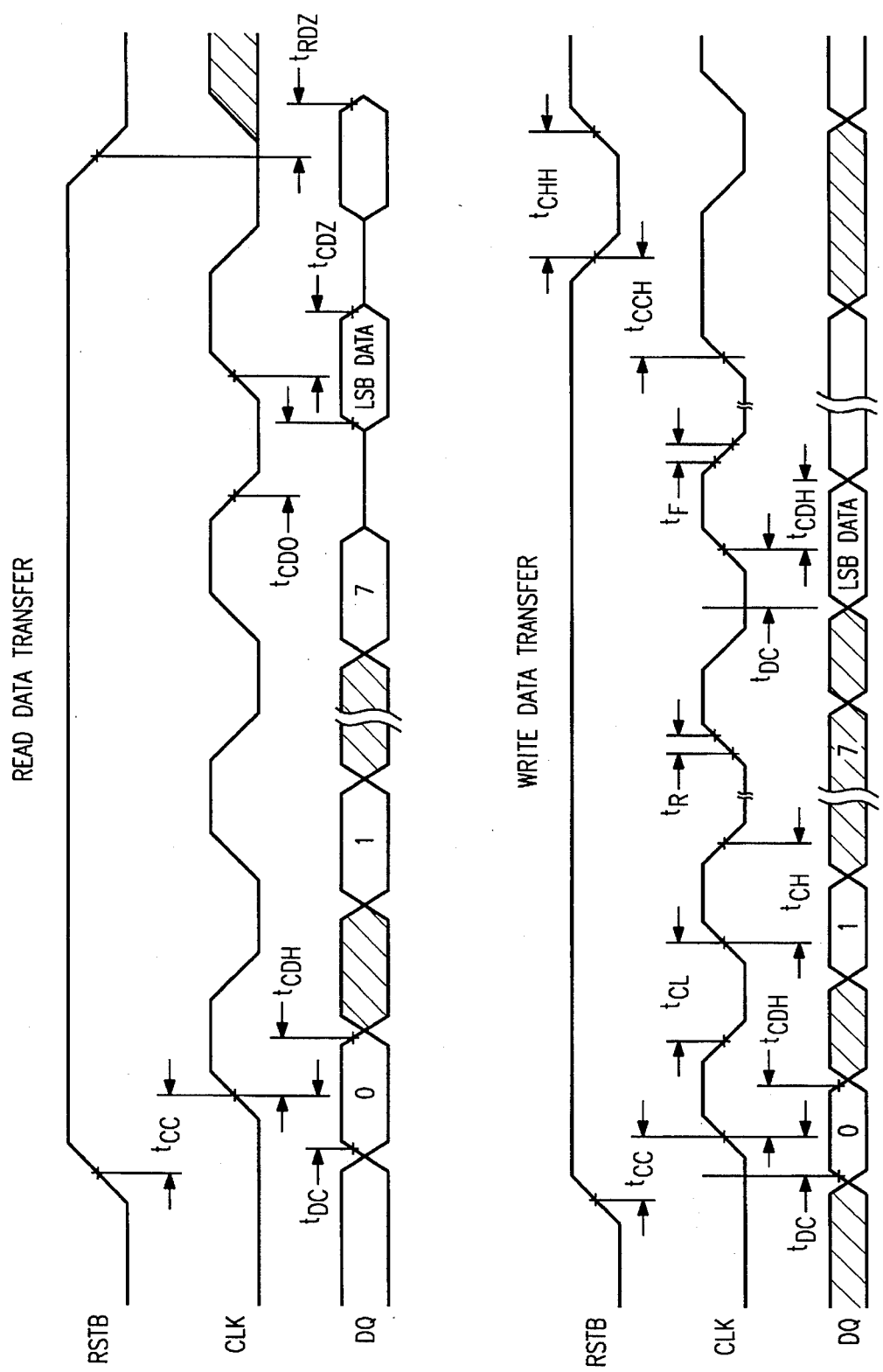
FIG. 15 illustrates three-wire communication.

Communication over three-wire serial port 230 in FIG. 2 permits control of the gains of output amplifiers 416 and 426 and AGC amplifier blocks 510 and 1310. The three-wire serial port consists of clock (CLK), reset (RST\ or RSTB), and data input/ouput (D/Q) signal lines. All data transfers are initiated by driving the RSTB input high. The RSTB input serves two functions: First it turns on control logic which allows access to the command register for a command sequence. Second, the RSTB signal provides a method of terminating data transfer. A clock cycle is a sequence of a falling edge followed by a rising edge. For data inputs, the data must be valid during the rising edge of a clock cycle. Command bits and data bits are input on the rising edge of the clock and data bits are output on the falling edge of the clock. The rising edge of the clock returns the DQ pin to a high impedance state. All data transfer terminates when RSTB is low and the DQ pin goes to a high impedance state. When data transfer is terminated using the RSTB signal the transition of RSTB must occur while the clock is at a high level to avoid distrubing the last bit of data. FIG. 15 shows timing diagrams for the CLK, RSTB, and DQ signals.

Figure 16A:
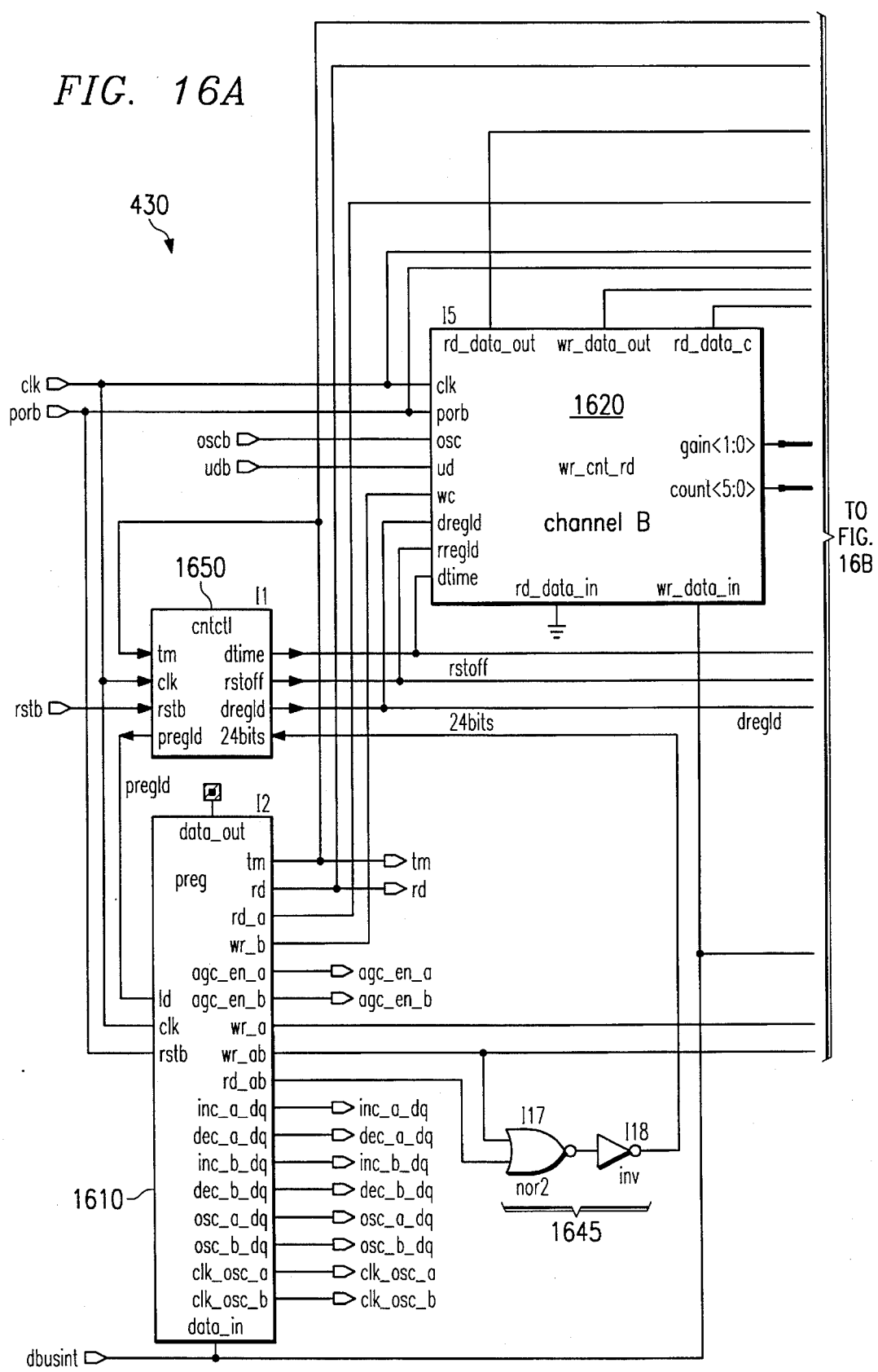
FIGS. 16a and 16b is a schematic circuit diagram of feed interface block 430 of FIGS. 4a and 4b, which is interface 230 of FIG. 2.
Figure 16B:
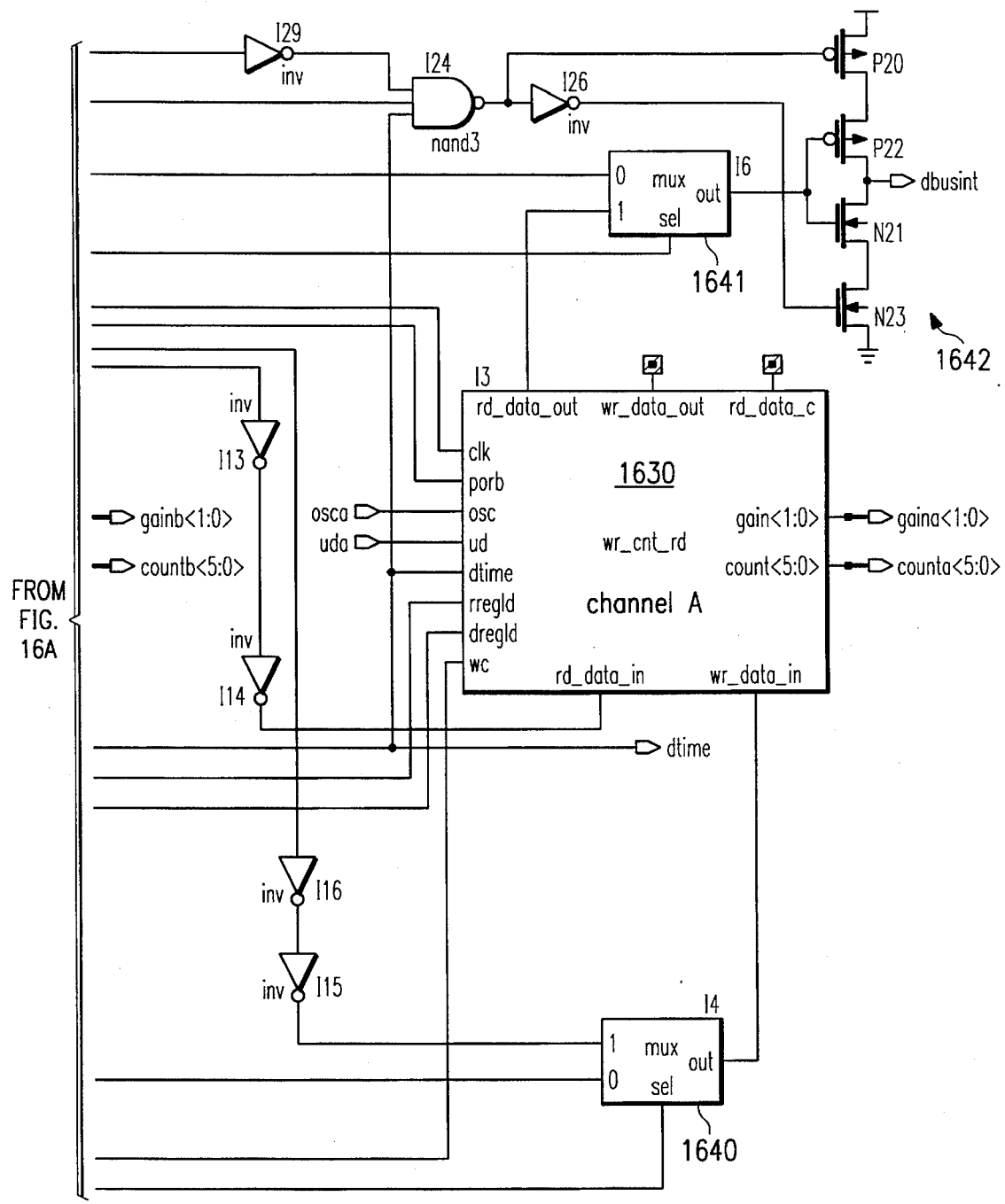

FIGS. 4a and 4b indicates that three-wire communication signal lines CLK and RSTB pass through hysteresis buffers 451 and 452, respectively, and feed interface block 430 shown in FIG. 16a and 16b; whereas, the DQ signal line connects to two-way input/output buffer 432 (FIG. 17) and then to interface block 430 on internal two-way line DBUS-INT at both an input and an output port. FIG. 16a and 16b shows interface block 430 as including program register block 1610 (FIG. 18a and 18b), channel B counter 1620, channel A counter 1630, multiplexers 1640–1641, and counter control block 1650 (FIG. 20).

Figure 18A:
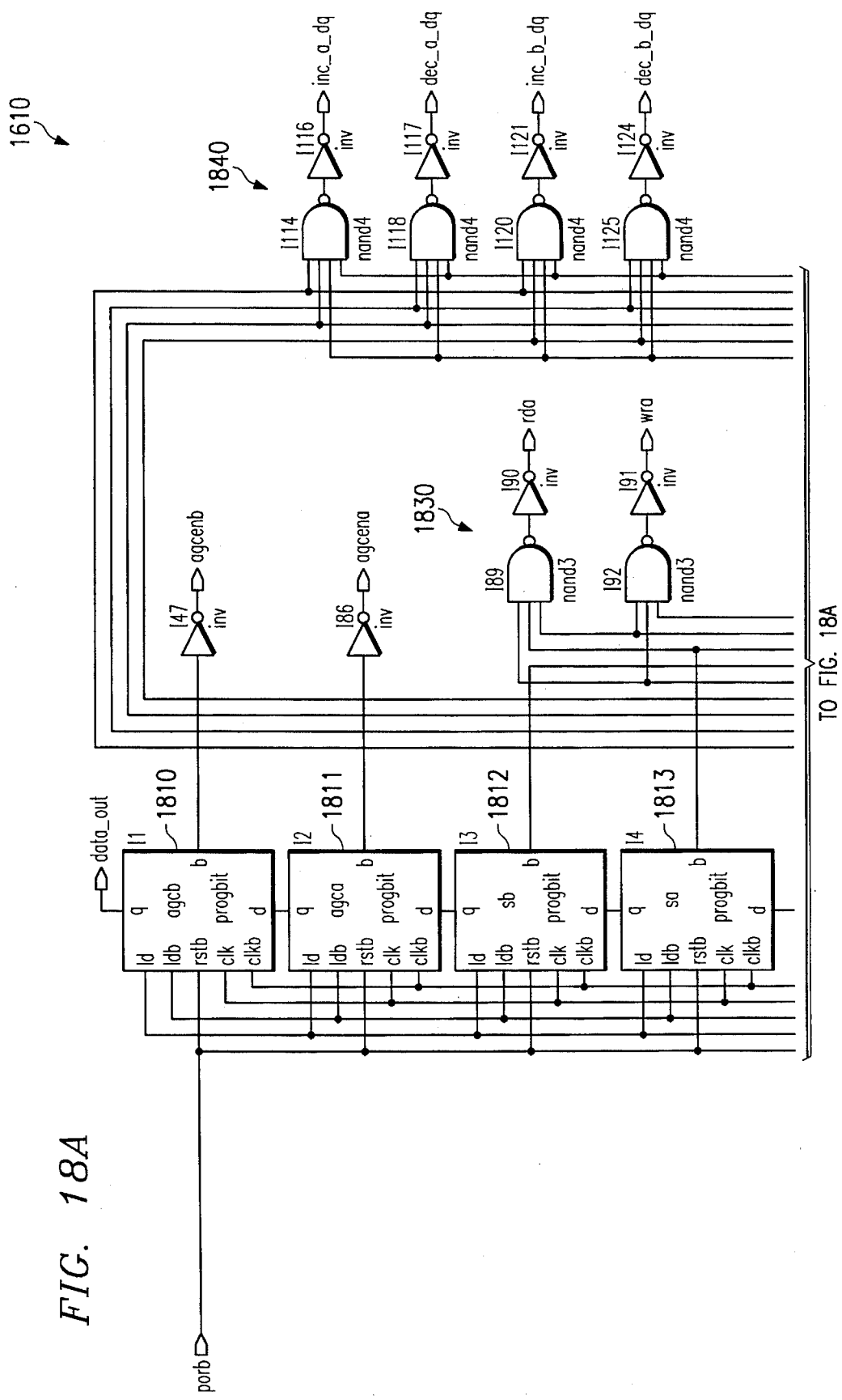
FIG. 18a and 18b is a schematic circuit diagram of program register block 1610 of FIGS. 16a and 16b.
Figure 18B:
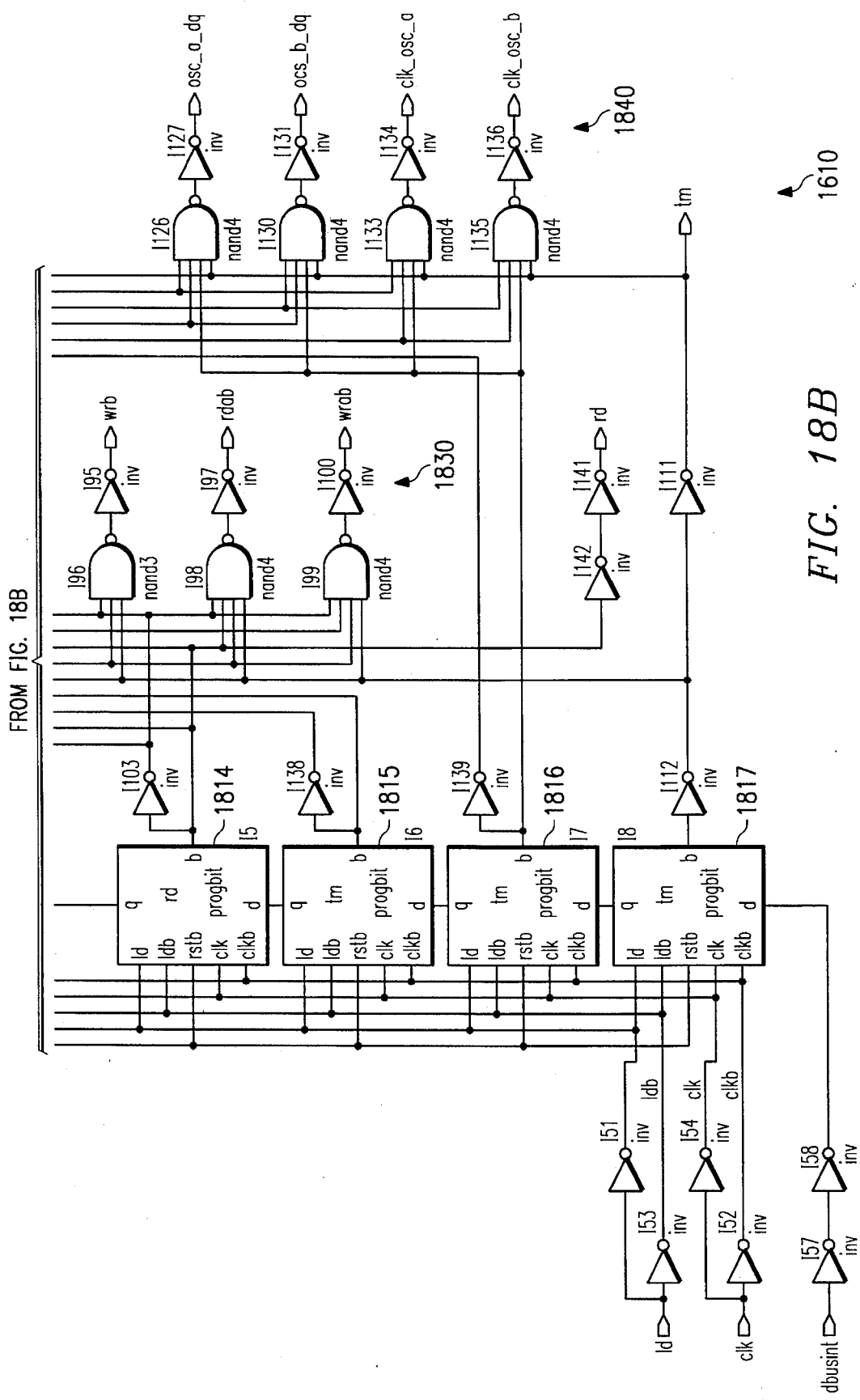
Figure 19:
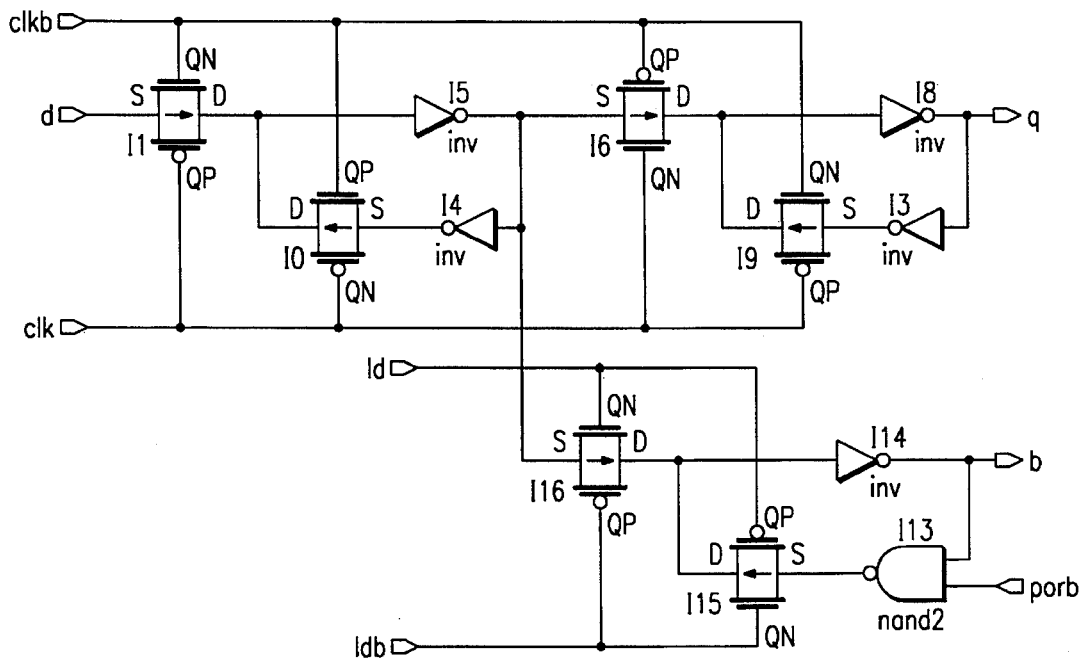
FIG. 19 is a schematic circuit diagram of flip-flop cells 1810, 1811, . . . , and 1817 of FIG. 18 within program register block 1610 of FIGS. 16a and 16b.

Communication with compander 200 initiates with the signal RSTB going high and the signal CLK toggling; see FIG. 15. The CLK toggling clocks data bits on DBUSINT (from DQ through two-way buffer 432) into the 8-bit shift register made of flip-flop cells 1810–1817 within program register block 1610 as shown in FIG. 18a and 18b. Each flip-flop cell has the structure shown in FIG. 19. The communication begins with an 8-bit protocol called the command word. As defined, the three most significant bits (bits 5–7) of the command word are reserved for internal use and should be 0 for all valid protocols. Bit 4, RD, indicates whether a read or write operation is occurring to channels A and B. RD=1 causes a read operation to be performed; RD=0 causes a write operation to be performed. The next two bits, bit 3, SA, and bit 2, SB, indicate which of the channels is being accessed by the read or write operation. With SA=1 and SB=0, channel A is being accessed, but not channel B. With SA=0 and SB=1, channel B alone is accessed. If SA=SB=1, both channels are accessed. The last two bits, bit 1, AGCA, and bit 2, AGCB, control the active status of the AGC circuit for channel A and channel B, respectively. The control of AGCA for channel A and AGCB for channel B is independent of whether a read or write operation is performed, or whether one or both channels are being accessed. Any valid 8-bit command protocol will enable/disable the AGC circuits of channels A and B depending upon the value of bit 1 and bit 0. A 0 in either bit 2 or bit 1 of the command protocol enables the AGC for that channel; a 1 in either bit 2 or bit 1 of the command protocol disable the AGC for that channel. The bits are clocked in with bit 0 first, so after eight clocks bit 0 is in flip-flop 1810.

Figure 17:
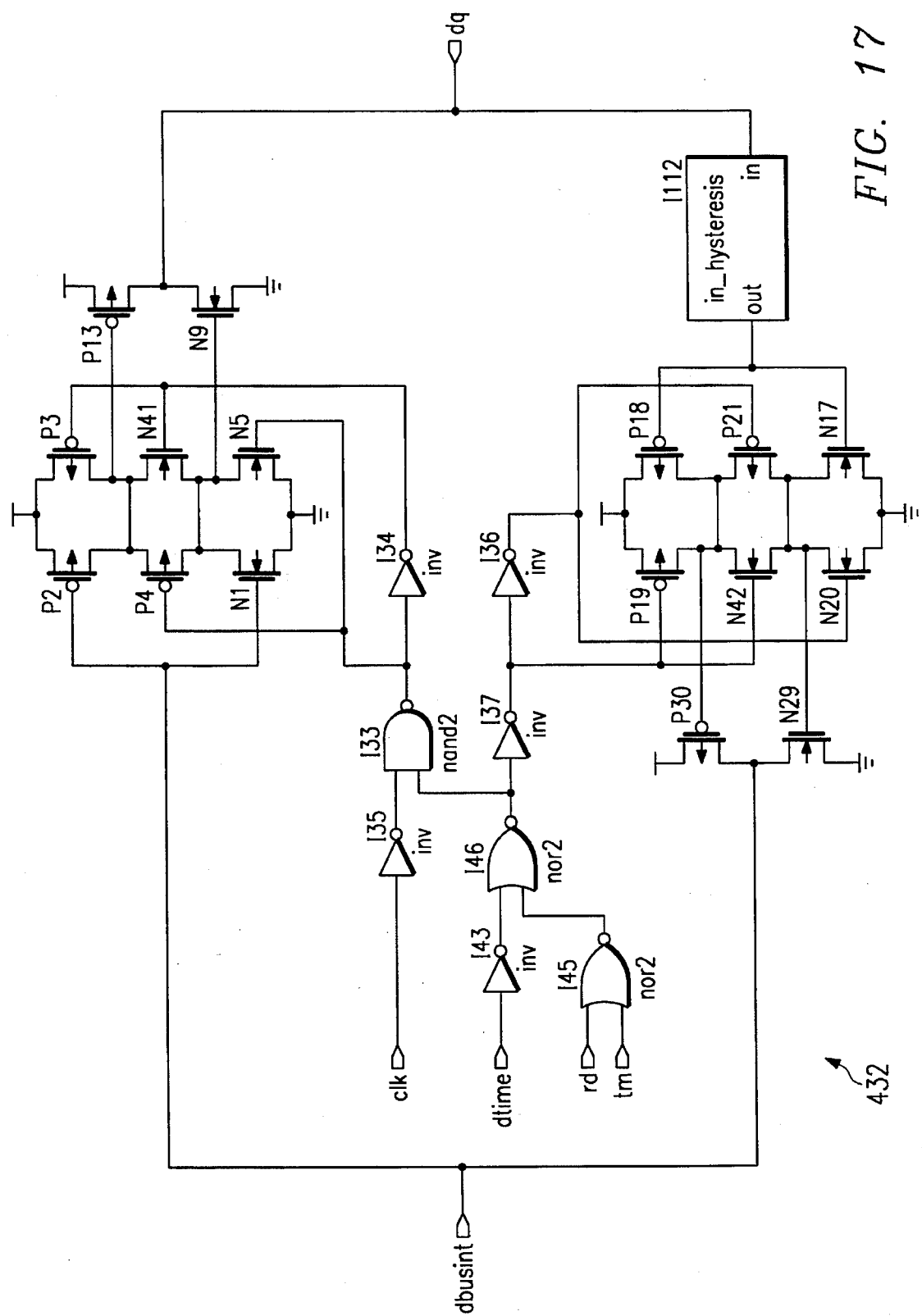
FIG. 17 is a schematic circuit diagram of two-way input/output buffer 432 of FIGS. 4a and 4b, which comprises part of interface 230 in FIG. 2.

The high pulse load signal LD from counter control block 1650 loads the command word bits stored in shift register cells 1810–1817 into the B outputs of each cell; see FIG. 17. Decoder 1830 then decodes the command word and outputs the enable AGC B (AGCENB) and enable AGC A (AGCENA) to blocks 422 and 412, respectively, the read channel A (RDA) signal to multiplexer 1641 for connecting channel A block 1630 to output driver 1642, the write channel A (WRA) signal to channel A block 1630, the write channel B (WRB) signal to channel B block 1620, the write channels A and B (WRAB) signal to both multiplexer 1640 and OR gate 1645, and the read channels A and B (RDAB) signal to OR gate 1645. OR gate 1645 outputs the 24BITS signal indicating that after the 8 command word bits 16 more bits for reading or writing both channel A and B blocks will be output or input. The bits to be written appear on DBUS-INT which feeds both channel B block 1620 and multiplexer 1640 which outputs to channel A block 1630. The TM signal remains low due to the command word bit 7 being 0, and this blocks decoder 1840. When TM is high (bit 7 equals 1), companding amplifier 200 is in test mode and decoder 1840 decodes bits 4–6 to drive signals to blocks 412, 415, and 422, 425 to read out parameters.

Figure 20:
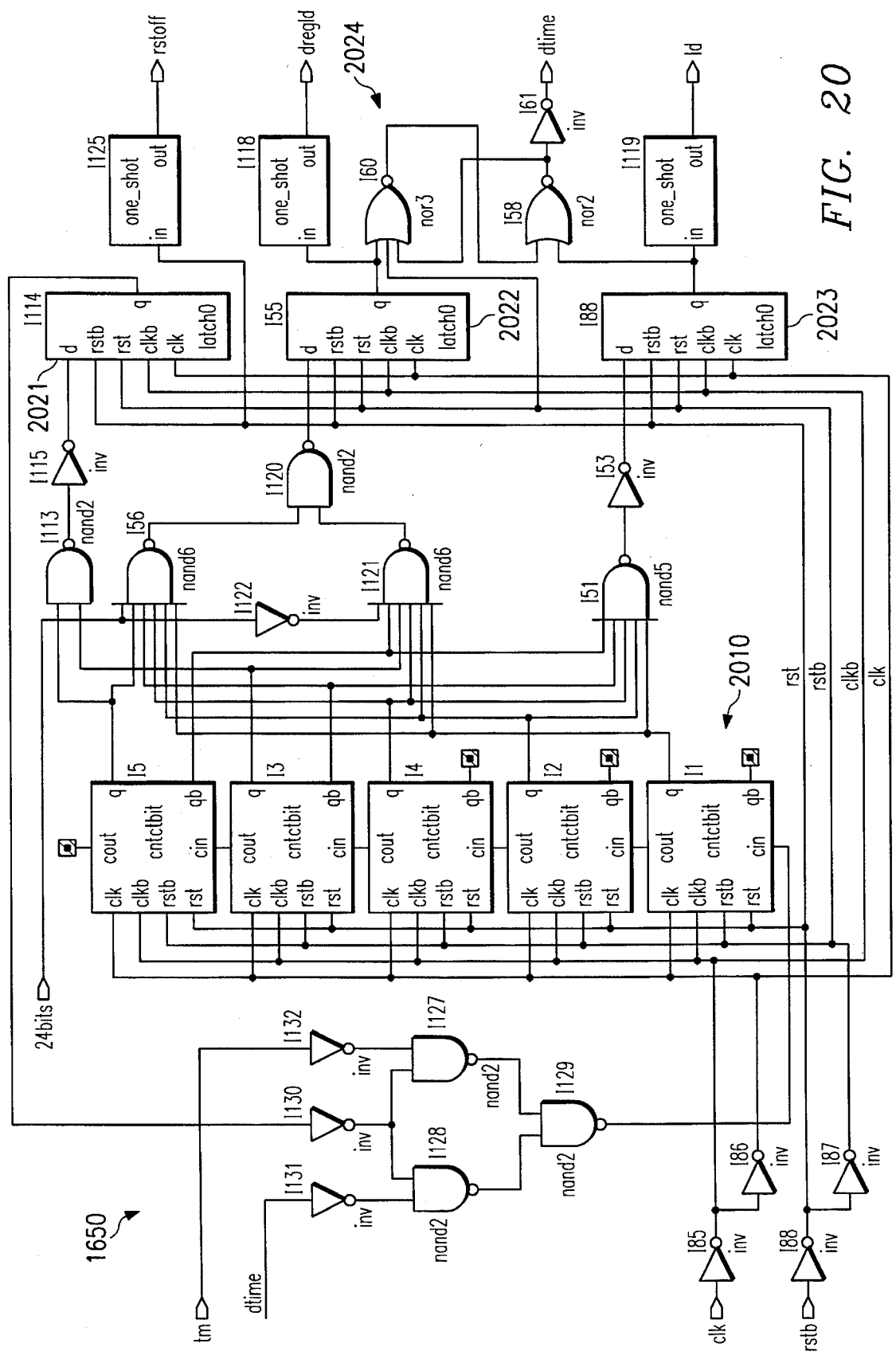
FIG. 20 is a schematic circuit diagram counter control block of FIGS. 16a and 16b.

The LD signal arises from counter control block 1650 as shown in FIG. 20. CLK clocks a high into 5-bit control register 2010 within counter control block 1650 and also resets flip-flops 2021–2023 and latch 2024.

Figure 21:
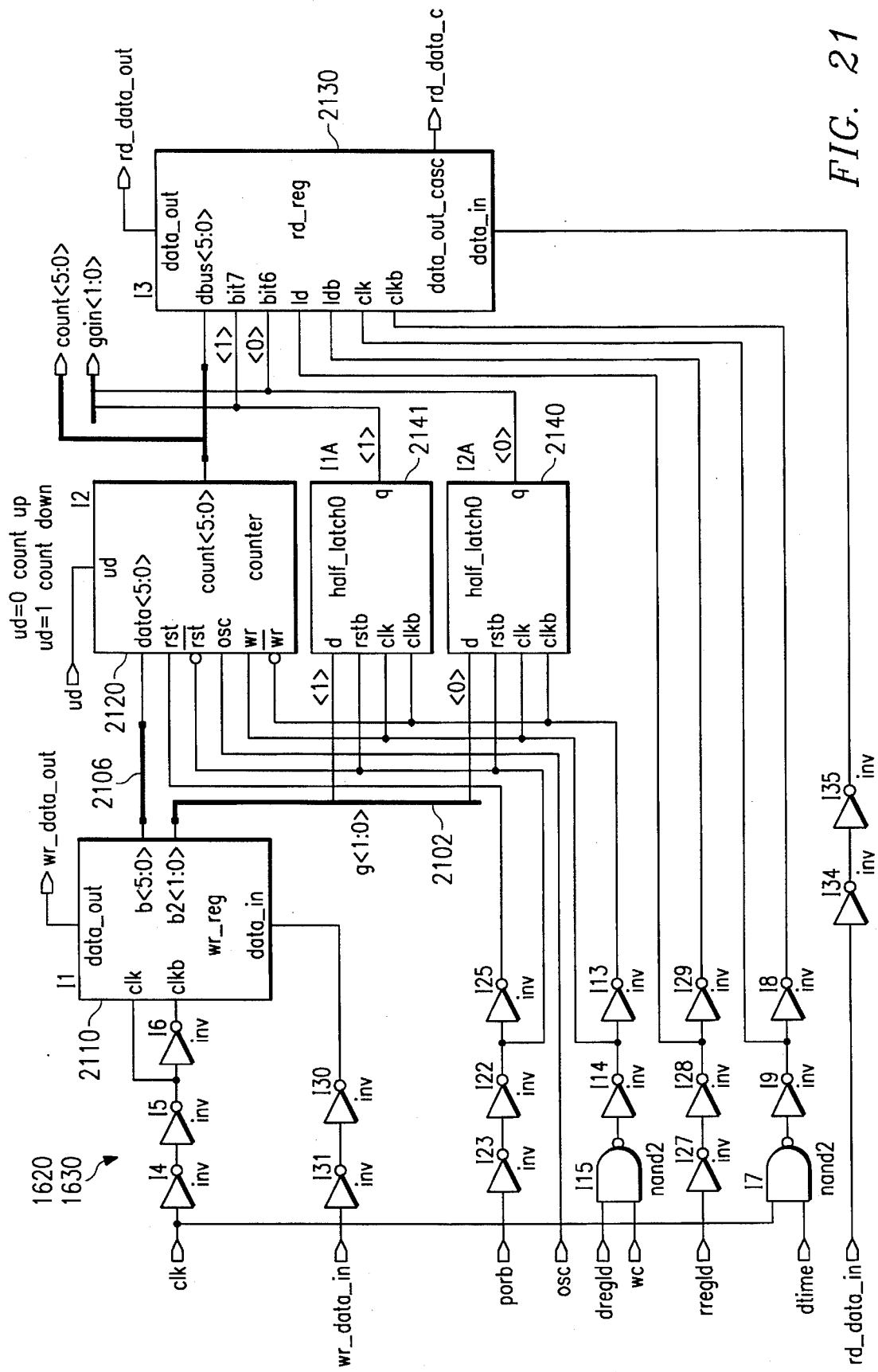
FIG. 21 is a schematic circuit diagram of channel A and B blocks 1620 and 1630 from FIGS. 16a and 16b.

FIG. 21 shows the structure of channel A and B blocks 1620 and 1630 as shift register 2110, up/down counter 2120, register 2130, and half latches 2140–2141. Bits written in serially enter shift register 2110 and then are transferred in parallel to counter 2120 on 6-bit bus 2106 and to half latches 1040 and 1041 on 2-bit bus 2102. Counter 120 outputs it contents on 6-bit bus COUNT<5:0> which feeds decoder 417 or 427, for channels A and B, respectively; and latches 2140–2141 output their 2-bits on bus GAIN<1:0> which drives the gain of output amplifiers 416 and 426 for channels A and B, respectively. The six bits on COUNT<5:0> for channel B are decoded by decoder 427 and provide a signal on one of the 64 NMOS transmission gate lines and on a corresponding one of the 64 PMOS transmission gate lines which control variable resistor 630 to set the gain of amplifier block 510; see FIGS. 7a, 7b and 7c where the 64 NMOS lines are denoted N0<15:0>, N1(14:0>, N2<15:0>, and N3<15:0>, and analogously notations for the 64 PMOS lines. The channel A COUNT<5:0> has similar decoding in decoder 417 and control of the gain of amplifier block 1310.

FIG. 21 also shows register 2130 with parallel feed from busses COUNT<5:0> and GAIN<1:0> and serial output at RD_DATA_OUT which leads to multiplexer 1641 (see FIG. 16) and then to the output driver 1642. Thus the contents the busses COUNT<5:0> and GAIN<1:0> can be read out and reveal the amplifier gain settings.

Automatic Gain Control

FIG. 21 also shows up/down counter 2120 has up/down input UD from AGC LIMIT block 412 for channel A and AGC LIMIT block 422 for channel B. Additionally, up/down counter 2120 also has clock input driven by the OSC signal from block oscillator block 415 for channel A and oscillator block 425 for channel B. Thus with automatic gain control in operation (feedback from ADET to AAGCIN or from BDET to BAGCIN), the peak level of amplifier blocks 510 and 1310 drives peak detectors 418 and 428 which feed AGC LIMIT blocks 412 and 422; see FIG. 22.

Figure 22:
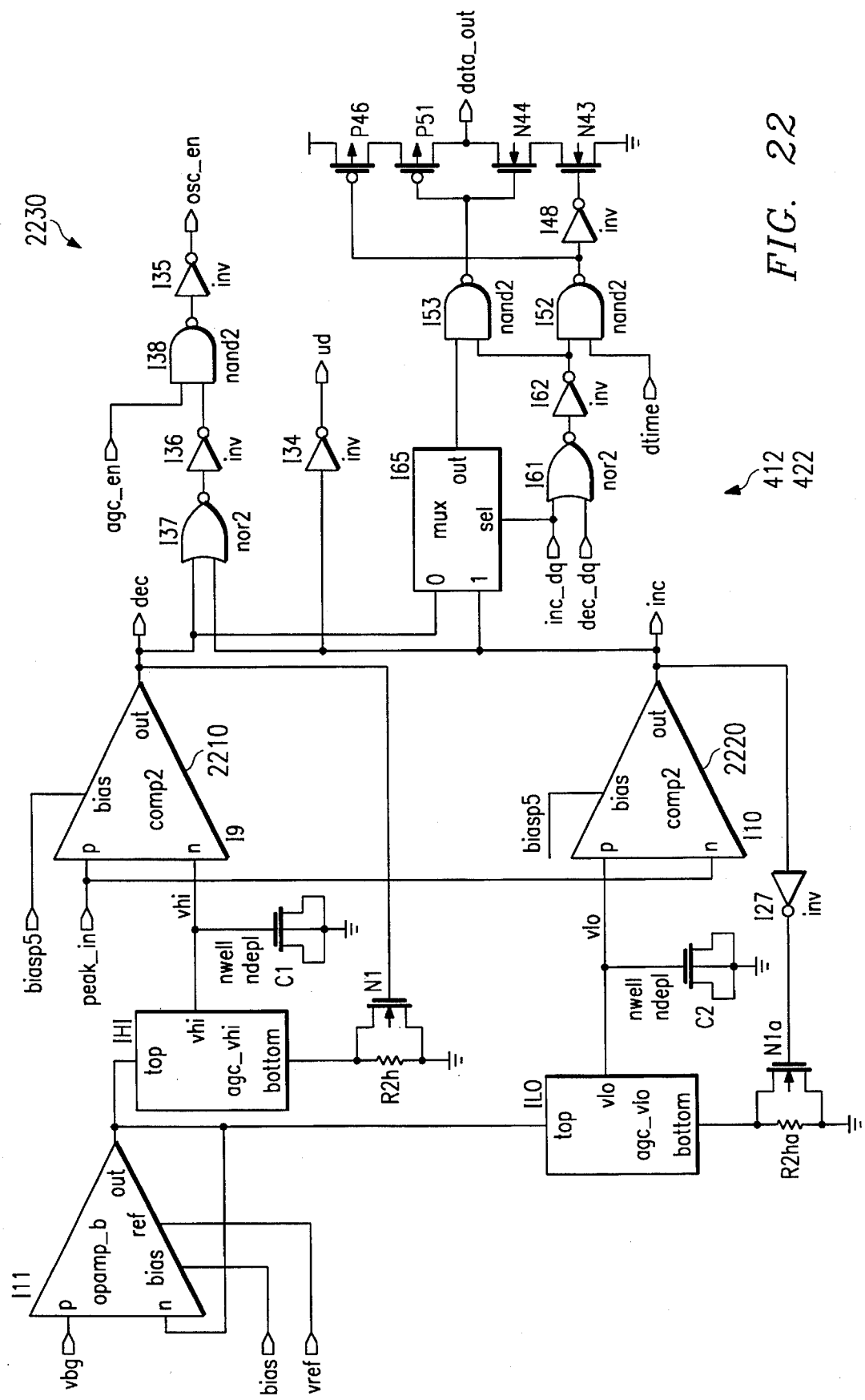
FIG. 22 is a schematic circuit diagram of AGC LIMIT blocks and 422 of FIGS. 4a and 4b, which are preferred embodiments of AGCs 212 and 222 of FIG. 2.

In FIG. 22, the peak input from ADET or BDET enters at node PEAK_IN and is compared to both a high limit voltage by comparator 2210 and a low limit voltage by comparator 2220; both limit voltages derive from a stable voltage reference (bandgap generator). If PEAK_IN is higher than the high limit voltage, then the decrement output DEC is active, and conversely, if PEAK_IN is below the lower limit voltage, then the increment output INC is active. Note that an inverted version of the INC output forms the UD signal. And lastly, if either DEC or INC is active together with AGC_EN high, then gates 2230 drive OSC_EN high to turn on oscillator block 415 and 425 for channels A and B, respectively. Oscillator blocks 415 and 425 provide a 3.9 Hz square wave to the OSC inputs of up/down counters 2120 in channels A and B. Thus this feedback from ADET or BDET adjusts the gain of amplifier blocks 510 and 1310 and is the automatic gain control.

Figure 23:
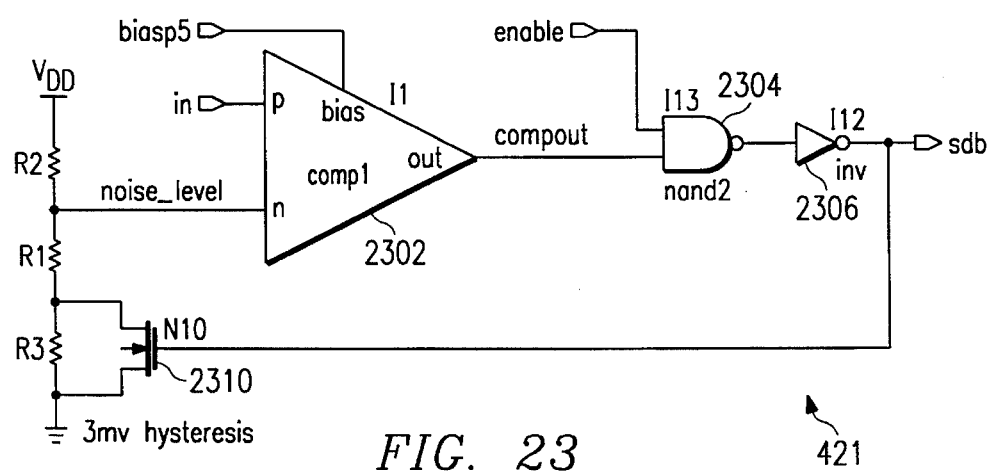
FIG. 23 is a schematic circuit diagram of silence detector and 421 of FIGS. 4a and 4b, which are preferred embodiments of AGCs and 222.

FIG. 23 shows silence detector 421 as opamp 2302 with its positive input connected to BIN, its negative input connected to Vdd voltage divider made of resistors R1, R2, R3, and output driving NAND gate 2304 and then inverter 2306. The voltage divider resistor R1 has resistance 100000 ohms, R2 has resistance 97630 ohms, and R3 has resistance 500 ohms but is bypassed by NMOS 2310. Thus the negative input to opamp 2302 is 0.507 Vdd when NMOS is off and 0.506 Vdd when NMOS is turned on. Thus when the voltage at BIN is less than 0.507 Vdd, the negative input of opamp 2302 exceeds the positive input and the output is low (ground) and the output of inverter 2306 also low which keeps NMOS 2310 off. Conversely, when the voltage at BIN exceeds 0.507 Vdd, then opamp 2302 has a high output as does (presuming the Enable input to NAND gate 2304 is also high) inverter 2306, which turns on NMOS 2310 and lowers the negative input of opamp 2302 to 0.506 Vdd; this provides about 3 mV of hysteresis for the BIN voltage driving opamp 2302. Recall that analog ground is at 0.5 Vdd ($V_{REF}$) and that input signals have frequencies in the range of 15 Hz to 10 KHz (which precludes a negative DC or slowly varying input). Thus when the voltage at BIN is less than 0.507 Vdd for any extended time interval, the analog input signal at BIN has amplitude of less than about 30 mV and may be presumed to be silence. A low output of inverter 2306 indicates silence. In general, an input at BIN will fluctuate with average about 0.5 Vdd, and the output of inverter 2306 will thus switch between high and low with switching rates up to the maximum frequency of the input (no more than 10 KHz). The output of inverter 2306 feeds oscillator block 425 shown in FIG. 14, so detected silence disables the oscillator block 425.

Fabrication

Companding amplifier 200 may be fabricated as a single integrated circuit by CMOS processing of silicon. The gate dimensions can be varied over a wide range, various CMOS processes such as metal, polysilicon or polycide gate, n-well, twin well, silicon-on-insulator, and so forth could be used.

Further Modifications and Variations

The preferred embodiments may be modified in many ways while retaining one of more of the features of analog compression and/or expansion amplifiers with digitally programmable gain and also with automatic gain control available.

What is claimed is:

1. A companding integrated circuit, comprising:

(a) analog compression circuitry to compress a first inputted signal;

(b) analog expansion circuitry to expand a second inputted signal;

(c) a first gain control coupled to said compression circuitry to condition said first inputted signal, analog signal for said analog compression circuitry; and (d) a second gain control coupled to said expansion circuitry to condition said second inputted signal for said analog expansion circuitry;

(e) wherein said first and second gain controls are programmable.

2. The companding integrated circuit of claim 1, wherein:
   (a) said compression circuitry square roots said first inputted signal and preserves its sign; and
   (b) said expansion circuitry squares said second inputted signal and preserves its sign.

3. The companding integrated circuit of claim 1, further wherein said first gain control has a first voltage gain and said second gain control has a second voltage gain and further comprising:
   (a) a first peak detector coupled to an output of said first gain control, said first peak detector providing level detection to drive said first gain control to adjust said first voltage gain of said first gain control; and
   (b) a second peak detector coupled to an output of said second gain control, said second peak detector providing level detection to drive said second gain control to adjust said second voltage gain of said second gain control.

4. The companding integrated circuit of claim 3, wherein:
   (a) said first and second gain controls each comprises an up/down counter having a count input, an up/down input, and contents, an oscillator coupled to the count input of said counter, a comparator with an output coupled to the up/down input of said counter and with inputs coupled to a reference voltage and an output of a corresponding one of said first and second peak detectors;
   (b) wherein the contents of said counters determine the first and second voltage gains of said first add second gain controls respectively.

5. The companding integrated circuit of claim 4, wherein:
   (a) said first and second gain controls each comprises an operational amplifier with resistive feedback incorporating a digital potentiometer, said digital potentiometers having a resistance;
   (b) wherein the contents of said counters determines the resistance of said potentiometers.

6. The companding integrated circuit of claim 4, further comprising:
   (a) a communication interface coupled to said counters;
   (b) wherein the contents of said counters can be programmed by signals applied to said communication interface.

7. The companding integrated circuit of claim 6, wherein said communication interface comprises three wires.

8. The companding integrated circuit of claim 1, wherein said first and second gain control is coupled to a communication interface.

9. The companding integrated circuit of claim 8, wherein said communication interface is a three-wire interface.

10. The companding integrated circuit of claim 1, wherein an output to said first peak detector is coupled to an input of said first gain control and further wherein an output to said second peak detector is coupled to an input of said second gain control.

11. The companding integrated circuit of claim 1, wherein said first and second gain controls are digital.

12. The companding integrated circuit of claim 1, wherein a first external capacitor is coupled to said first peak detector and a second external capacitor is coupled to said second peak detector.

13. The companding integrated circuit of claim 1, said first inputted signal having a first shape and second inputted signal having a second shape and said compression changing said first shape and said expansion circuitry changing said second shape.

14. The companding integrated circuit of claim 1, further wherein said first and second gain controls are automatic.

15. A compander integrated circuit, comprising:
   (a) analog compression circuitry to compress a first inputted signal;
   (b) analog expansion circuitry to expand a second inputted signal;
   (c) a first gain control coupled to said compression circuitry to condition said first inputted signal for said analog compression circuitry; and
   (d) a second gain control coupled to said expansion circuitry to condition said second inputted signal for said analog expansion circuitry.

16. The compander integrated circuit of claim 15, wherein:
   (a) said compression circuitry square roots said first inputted signal and preserves its sign; and
   (b) said expansion circuitry squares said second inputted signal and preserves its sign.

17. The compander integrated circuit of claim 15, further wherein said first gain control has a first voltage gain and said second gain control has a second voltage gain and further comprising:
   (a) a first peak detector coupled to an output of said first gain control, said first peak detector providing level detection to drive said first gain control to adjust said first voltage gain of said first gain control; and
   (b) a second peak detector coupled to an output of said second gain control, said second peak detector providing level detection to drive said second gain control to adjust said second voltage gain of said second gain control.

18. The compander integrated circuit of claim 15, wherein:
   (a) said first and second gain controls each comprises an up/down counter having a count input, an up/down input, and contents, an oscillator coupled to the count input of said counter, a comparator with an output coupled to the up/down input of said counter and with inputs coupled to a reference voltage and an output of a corresponding one of said first and second peak detectors;
   (b) wherein the contents of said counters determine the gain of said first and second gain controls.

19. The compander integrated circuit of claim 18, wherein:
   (a) said first and second gain controls each comprises an operational amplifier with resistive feedback incorporating a digital potentiometer, said digital potentiometers having a resistance;
   (b) wherein the contents of said counters determines the resistance of said potentiometers.

20. The companding integrated circuit of claim 18, further comprising:
   (a) a communication interface coupled to said counters;
   (b) wherein the contents of said counters can be programmed by signals applied to said communication interface.

21. The companding integrated circuit of claim 20, wherein said communication interface comprises three wires that transmit information selected from the group consisting clock, reset, and input/output data.

22. The companding integrated circuit of claim 15, wherein said first and second gain control is coupled to a communication interface.

23. The companding integrated circuit of claim 22, wherein said communication interface is a three-wire interface.

24. The companding integrated circuit of claim 15, wherein an output to said first peak detector is coupled to an input of said first gain control and further wherein an output to said second peak detector is coupled to an input of said second gain control.

25. The companding integrated circuit of claim 15, wherein said first and second gain controls are digital.

26. The companding integrated circuit of claim 15, wherein a first external capacitor is coupled to said first peak detector and a second external capacitor is coupled to said second peak detector.

27. The companding integrated circuit of claim 15, further wherein said first and second inputted signals have a shape and said compression and expansion circuitry change said shape of said first and second inputted signals respectively.

28. The companding integrated circuit of claim 15, further wherein said first and second gain controls are automatic.

29. An integrated circuit, comprising:
 (a) analog compression circuitry to compress a first inputted signal; and
 (b) a first gain control coupled to said compression circuitry to condition said first inputted signal for said analog compression circuitry
 (c) wherein said first gain control is programmable by a second inputted signal.

30. The integrated circuit of claim 29, wherein:
 (a) said compression circuitry square roots said first inputted signal and preserves its sign.

31. The integrated circuit of claim 29, further wherein said first gain control has a first voltage gain and further comprising:
 (a) a first peak detector coupled to an input of said compression circuitry and to an output of said first gain control, said first peak detector providing level detection to drive said first gain control to adjust said first voltage gain of said first gain control.

32. The integrated circuit of claim 29, wherein:
 (a) said first gain control comprises an up/down counter having a count input, an up/down input, and contents,
 an oscillator coupled to the count input of said counter,
 a comparator with an output coupled to the up/down input of said counter and with inputs coupled to a reference voltage and an output of a corresponding one of said first and second peak detectors;
 (b) wherein the contents of said counters determine the gain of said first gain control.

33. The integrated circuit of claim 32, wherein:
 (a) said first gain control comprises an operational amplifier with resistive feedback incorporating a digital potentiometer, said digital potentiometers having a resistance;
 (b) wherein the contents of said counters determines the resistance of said potentiometers.

34. The integrated circuit of claim 32, further comprising:
 (a) a communication interface coupled to said counters;
 (b) wherein the contents of said counters can be programmed by signals applied to said communication interface.

35. The integrated circuit of claim 34, wherein said communication interface comprises three wires.

36. The integrated circuit of claim 34, wherein said communication interface comprises three wires that transmit information selected from the group consisting clock, reset, and input/output data.

37. The integrated circuit of claim 34, wherein said first gain control is coupled to a communication interface.

38. The integrated circuit of claim 37, wherein said communication interface is a three-wire interface.

39. The integrated circuit of claim 29, wherein an output to said first peak detector is coupled to an input of said first gain control.

40. The integrated circuit of claim 29, wherein said first gain control is digital.

41. The integrated circuit of claim 29, wherein a first external capacitor is coupled to said first peak detector.

42. The integrated circuit of claim 29, said first inputted signal having a shape and said compression circuitry changing said shape of said first inputted signal respectively.

43. The integrated circuit of claim 29, further wherein said first gain control is automatic.

\* \* \* \* \*

UNITED STATES PATENT AND TRADEMARK OFFICE
CERTIFICATE OF CORRECTION

PATENT NO. : 5,473,279
DATED : Dec. 5, 1995
INVENTOR(S) : D'Angelo et al.

It is certified that error appears in the above-indentified patent and that said Letters Patent is hereby corrected as shown below:

| | |
|---|---|
| Column 1, line 20 | Replace "fights" With --rights-- |
| Column 2, line 25 | After "4b" Insert --and-- |
| Column 2, line 66 | Delete "and" |
| Column 4, line 11 | Replace "rerquirements" With --requirements-- |
| Column 4, line 29 | Replace "shows" With --show-- |
| Column 4, line 34 | Replace "including" With --includes-- |
| Column 4, line 45 | Replace "correlates" With --correlate-- |
| Column 4, line 46 | Insert a period after "fashion" |

UNITED STATES PATENT AND TRADEMARK OFFICE
CERTIFICATE OF CORRECTION

PATENT NO. : 5,473,279

DATED : Dec. 5, 1995

INVENTOR(S) : D'Angelo et al.

Page 2 of 3

It is certified that error appears in the above-indentified patent and that said Letters Patent is hereby corrected as shown below:

| | |
|---|---|
| Column 4, line 60 | After "corresponds" Insert --to-- |
| Column 4, line 66 | After "corresponds" Insert --to-- |
| Column 5, line 48 | Replace "an" With --a-- |
| Column 8, line 17 | Replace "distrubing" With --disturbing-- |
| Column 9, line 26 | Replace "it" With --its-- |
| Column 9, line 37 | Replace "N1(14:0> " With --N1<14:0>;-- |
| Column 9, line 45 | After "contents" Insert --of-- |

UNITED STATES PATENT AND TRADEMARK OFFICE
CERTIFICATE OF CORRECTION

PATENT NO. : 5,473,279
DATED : Dec. 5, 1995
INVENTOR(S) : D'Angelo et al.

It is certified that error appears in the above-indentified patent and that said Letters Patent is hereby corrected as shown below:

| | |
|---|---|
| Column 10, line 19 | After "2306" Insert --is-- |
| Column 10, line 36 | Replace "of-the" With --of the-- |
| Column 10, line 60 | Replace "signal, analog" With --signal-- |
| Column 10, line 61 | Delete "signal" |
| Column 11, line 30 | Replace "add" With --and-- |
| Column 13, line 27 | Insert a semicolon after "circuitry" |

Signed and Sealed this

Third Day of June, 1997

Attest:

BRUCE LEHMAN

*Attesting Officer*          Commissioner of Patents and Trademarks